United States Patent
Hamamoto et al.

(10) Patent No.: US 12,241,928 B2
(45) Date of Patent: Mar. 4, 2025

(54) ELECTROMAGNETIC WAVE TEST DEVICE AND ELECTROMAGNETIC WAVE TEST METHOD

(71) Applicant: TDK CORPORATION, Tokyo (JP)

(72) Inventors: Shotaro Hamamoto, Tokyo (JP); Masataka Midori, Tokyo (JP); Hiroshi Kurihara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 146 days.

(21) Appl. No.: 18/121,091

(22) Filed: Mar. 14, 2023

(65) Prior Publication Data
US 2023/0296665 A1    Sep. 21, 2023

(30) Foreign Application Priority Data
Mar. 17, 2022    (JP) ................................ 2022-042598

(51) Int. Cl.
*G01R 31/28*    (2006.01)
(52) U.S. Cl.
CPC ................................ *G01R 31/2862* (2013.01)
(58) Field of Classification Search
CPC .................................................. G01R 31/2862
See application file for complete search history.

(56) References Cited

U.S. PATENT DOCUMENTS

2014/0197761 A1*  7/2014  Grandemenge ...  H01J 37/32302
                                                      219/709

OTHER PUBLICATIONS

Myron L. Crawford et al. "Measurement and Evaluation of a TEM/Reverberating Chamber". NIST Technical Note 1342, Jul. 1990.

\* cited by examiner

*Primary Examiner* — Alesa Allgood
(74) *Attorney, Agent, or Firm* — Oliff PLC

(57) ABSTRACT

A electromagnetic wave test device includes: a reverberation chamber; a first antenna installed inside the chamber and radiating electromagnetic waves of a frequency lower than the chamber's first resonance frequency; a second antenna installed inside the chamber and radiating electromagnetic waves of a frequency equal to or higher than first resonance frequency; a power supply device connected between a grounding member and first antenna and feeding power to the first antenna; a dummy load connected between the grounding member and first antenna; a first power loss inhibiting unit having an impedance corresponding to an allowed value for power loss according to first antenna in a case wherein electromagnetic waves are radiated from the second antenna; and a switching unit including a first switching unit that switches a connection destination of first antenna to one of the dummy load and the first power loss inhibiting unit.

22 Claims, 8 Drawing Sheets

ELECTROMAGNETIC WAVE TEST DEVICE AND ELECTROMAGNETIC WAVE TEST METHOD

BACKGROUND OF THE INVENTION

Field of the Invention

The present invention relates to electromagnetic wave test device and electromagnetic waves test method.

Priority is claimed on Japanese Patent Application No. 2022-042598, filed Mar. 17, 2022, the content of which is incorporated herein by reference.

Description of Related Art

Electromagnetic wave test devices performing radiation immunity tests using a reverberation chamber have been researched and developed. A radiation immunity test is a test for checking whether or not an electronic device operates normally by applying a uniform electric field of which an intensity is high to the electronic device disposed inside a reverberation chamber as a test piece. For example, the test piece is a EUT (Equipment Under Test) or a DUT (Device Under Test). In this description, an electric field may also be understood as a magnetic field or an electro-magnetic field.

A reverberation chamber is composed of a cavity resonator made of a metal, an antenna device that radiates electromagnetic waves inside the cavity resonator, and an electromagnetic stirrer that stirs the electromagnetic waves radiated from the antenna device. The reverberation chamber generates an electric field applied to a test piece using a resonance phenomenon of electromagnetic waves inside the cavity resonator. In a distribution of the intensity of an electric field generated in this way, variations of the intensity due to a size of the cavity resonator appear. In other words, the distribution of the intensity of an electric field generated by the cavity resonator becomes a non-uniform distribution. For this reason, the electromagnetic stirrer stirs electromagnetic waves inside the cavity resonator and causes the distribution of the intensity of the electric field generated by the cavity resonator to approach a uniform distribution. In accordance with this, the reverberation chamber can allow a user to perform a radiation immunity test with high test quality. For the convenience of this description, a method of performing a radiation immunity test using a resonance phenomenon inside a reverberation chamber in this way will be described as a reverberation chamber method.

In the reverberation chamber method, it is known that a resonance frequency of a cavity resonator is in inverse proportion to the size of the cavity resonator. For this reason, in a radiation immunity test according to the reverberation chamber method, the lower the frequency of an electric field generated using a resonance phenomenon inside a reverberation chamber is, the larger the volume of the reverberation chamber needs to be formed.

On the other hand, in a radiation immunity test using an anechoic chamber in place of the reverberation chamber, an electric field of a low frequency band is applied to an electronic device inside the anechoic chamber. The low frequency band is a frequency band lower than a lowest usable frequency (LUF) for functioning as a reverberation chamber, a frequency band lower than a resonance frequency of a lowest order of the reverberation chamber (in other words, a first resonance frequency), or the like. When a radiation immunity test using an electric field of such a low frequency band is to be performed inside a reverberation chamber, the size of the reverberation chamber becomes about 10 km. The reverberation chamber of such a size restricts the degree of freedom of a place in which it is installed, which is not desirable. For this reason, in recent years, it has become preferable that the reverberation chamber have a device that can perform a radiation immunity test using a low frequency band and have a size with which an electric device can be inserted therein.

As a device that can perform a radiation immunity test using a low frequency band inside a reverberation chamber, a device called a TLS (Transmission Line System) is known. As TLSs, a device applying an electric field from an antenna such as a TEM (Transverse Electro-Magnetic) plate antenna, or a strip line, and the like to an electronic device are known. For the convenience of this description, a method for performing a radiation immunity test using a TLS will be described as a TLS method.

Here, in a radiation immunity test in which a TLS is installed inside a reverberation chamber, and the reverberation chamber method and the TLS method are performed in combination, compared to a radiation immunity test only using the reverberation chamber method, an electric field of a wider frequency band can be applied to an electronic device with uniform intensity while an increase in the size of the reverberation chamber is inhibited (see Non Patent Document 1). For this reason, in recent years, it has become more common to install a TLS inside a reverberation chamber, and perform a radiation immunity test using the reverberation chamber method and the TLS method in combination. For the convenience of this description, a method of performing a radiation immunity test using the reverberation chamber method and the TLS method in combination will be described as a hybrid method.

[Non Patent Document 1] Myron L. Crawford, Mark T. Ma, John M. Ladbury, Bill F. Riddle, "Measurement and Evaluation of a TEM/Reverberating chamber," NIST Technical Note 1342, July, 1990

SUMMARY OF THE INVENTION

In the hybrid method, in a case in which a radiation immunity test using a high frequency band is performed, electromagnetic waves are radiated from an antenna device installed inside a cavity resonator. The high frequency band is a frequency band of a lowest frequency for functioning as a reverberation chamber or higher, a frequency band of a resonance frequency of the lowest order of the reverberation chamber (in other words, a first resonance frequency) or higher, or the like. In addition, in the hybrid method, in a case in which a radiation immunity test using a low frequency band is performed, radiation of electromagnetic waves from the antenna device stops, and an electric field is applied from the TLS installed inside the cavity resonator to an electronic device.

However, in the hybrid method, in a case in which a radiation immunity test using a high frequency band is performed, a part of electromagnetic waves radiated from the antenna device may be received by the TLS not applying an electric field to an electronic device, as electric power. This increases power loss in the radiation immunity test according to the hybrid method, which is not desirable.

The present invention is in consideration of such situations, and an object thereof is to provide electromagnetic wave test device and electromagnetic waves test method capable of inhibiting an increase of power loss in a radiation immunity test according to a hybrid method.

According to one aspect of the present invention, there is provided electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a dummy load connected between the member having the ground electric potential and the first antenna; a first power loss inhibiting unit having an impedance corresponding to an allowed value for power loss according to the first antenna in a case in which electromagnetic waves are radiated from the second antenna; and a switching unit including a first switching unit that switches a connection destination of the first antenna to one of the dummy load and the first power loss inhibiting unit.

In addition, according to one aspect of the present invention, there is provided electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a second power loss inhibiting unit having an impedance corresponding to an allowed value for power loss according to the first antenna of a case in which electromagnetic waves are radiated from the second antenna and configured to be different from an open end; and a switching unit including a second switching unit that switches a connection destination of the first antenna to one of the power supply device and the second power loss inhibiting unit.

In addition, according to one aspect of the present invention, there is provided electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a dummy load connected between the member having the ground electric potential and the first antenna; a first power loss inhibiting unit having an impedance determined in advance; a second power loss inhibiting unit having an impedance determined in advance; and a switching unit including a first switching unit that switches a connection destination of the first antenna to one of the dummy load and the first power loss inhibiting unit and a second switching unit that switches the connection destination of the first antenna to one of the power supply device and the second power loss inhibiting unit, wherein a combined impedance of the impedance of the first power loss inhibiting unit and the impedance of the second power loss inhibiting unit is an impedance corresponding to an allowed value for power loss according to the first antenna of a case in which electromagnetic waves are radiated from the second antenna.

In addition, according to one aspect of the present invention, there is provided electromagnetic waves test method using electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a dummy load connected between the member having the ground electric potential and the first antenna; a first power loss inhibiting unit having an impedance corresponding to an allowed value for power loss according to the first antenna in a case in which electromagnetic waves are radiated from the second antenna; and a switching unit including a first switching unit that switches a connection destination of the first antenna to one of the dummy load and the first power loss inhibiting unit, the electromagnetic wave test method including: switching a connection destination of the first antenna to the dummy load in a case in which electromagnetic waves are radiated from the first antenna and switching the connection destination of the first antenna to the first power loss inhibiting unit in a case in which electromagnetic waves are radiated from the second antenna.

In addition, according to one aspect of the present invention, there is provided electromagnetic waves test method using electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a second power loss inhibiting unit having an impedance corresponding to an allowed value for power loss according to the first antenna of a case in which electromagnetic waves are radiated from the second antenna and configured to be different from an open end; and a switching unit including a second switching unit that switches a connection destination of the first antenna to one of the power supply device and the second power loss inhibiting unit, the electromagnetic wave test method including: switching a connection destination of the first antenna to the power supply device in a case in which electromagnetic waves are radiated from the first antenna and switching the connection destination of the first antenna to the second power loss inhibiting unit in a case in which electromagnetic waves are radiated from the second antenna.

In addition, according to one aspect of the present invention, there is provided electromagnetic waves test method using electromagnetic wave test device including: a reverberation chamber; a first antenna installed inside the reverberation chamber and radiating electromagnetic waves of a frequency lower than a first resonance frequency of the reverberation chamber; a second antenna installed inside the reverberation chamber and radiating electromagnetic waves of a frequency equal to or higher than the first resonance frequency; a power supply device connected between a member having a ground electric potential and the first antenna and feeding power to the first antenna; a dummy load connected between the member having the ground electric potential and the first antenna; a first power loss inhibiting unit; a second power loss inhibiting unit; and a switching unit including a first switching unit that switches a connection destination of the first antenna to one of the dummy load and the first power loss inhibiting unit and a second switching unit that switches the connection destination of the first antenna to one of the power supply device and the second power loss inhibiting unit, wherein a combined impedance of the impedance of the first power loss inhibiting unit and the impedance of the second power loss inhibiting unit is an impedance corresponding to an allowed value for power loss according to the first antenna of a case in which electromagnetic waves are radiated from the second antenna, the electromagnetic wave test method including: switching a connection destination of the first antenna from the first power loss inhibiting unit to the dummy load using the first switching unit and switching the connection destination of the first antenna from the second power loss inhibiting unit to the power supply device using the second switching unit in a case in which electromagnetic waves are radiated from the first antenna; and switching the connection destination of the first antenna from the dummy load to the first power loss inhibiting unit using the first switching unit and switching the connection destination of the first antenna from the power supply device to the second power loss inhibiting unit using the second switching unit in a case in which electromagnetic waves are radiated from the second antenna.

According to the present invention, an increase of power loss can be inhibited in a radiation immunity test according to a hybrid method.

BRIEF DESCRIPTION OF THE DRAWINGS

FIG. 11 is a diagram illustrating an example of a first antenna 111 configured using a plurality of lead wires, a plurality of flat plates, and the like.

DETAILED DESCRIPTION OF THE INVENTION

Embodiment

Hereinafter, an embodiment of the present invention will be described with reference to the drawings. Hereinafter, for simplification of description, a case in which there is little to no electric potential difference between a plurality of members having the ground electric potential will be described. In addition, in the following description, an electric field may also be understood as a magnetic field or may be understood as an electromagnetic field. Furthermore, hereinafter, for the convenience of description, an intensity of an electric field will be simply described as an electric field intensity.

<Configuration of Electromagnetic Wave Test Device>

Figure 1:
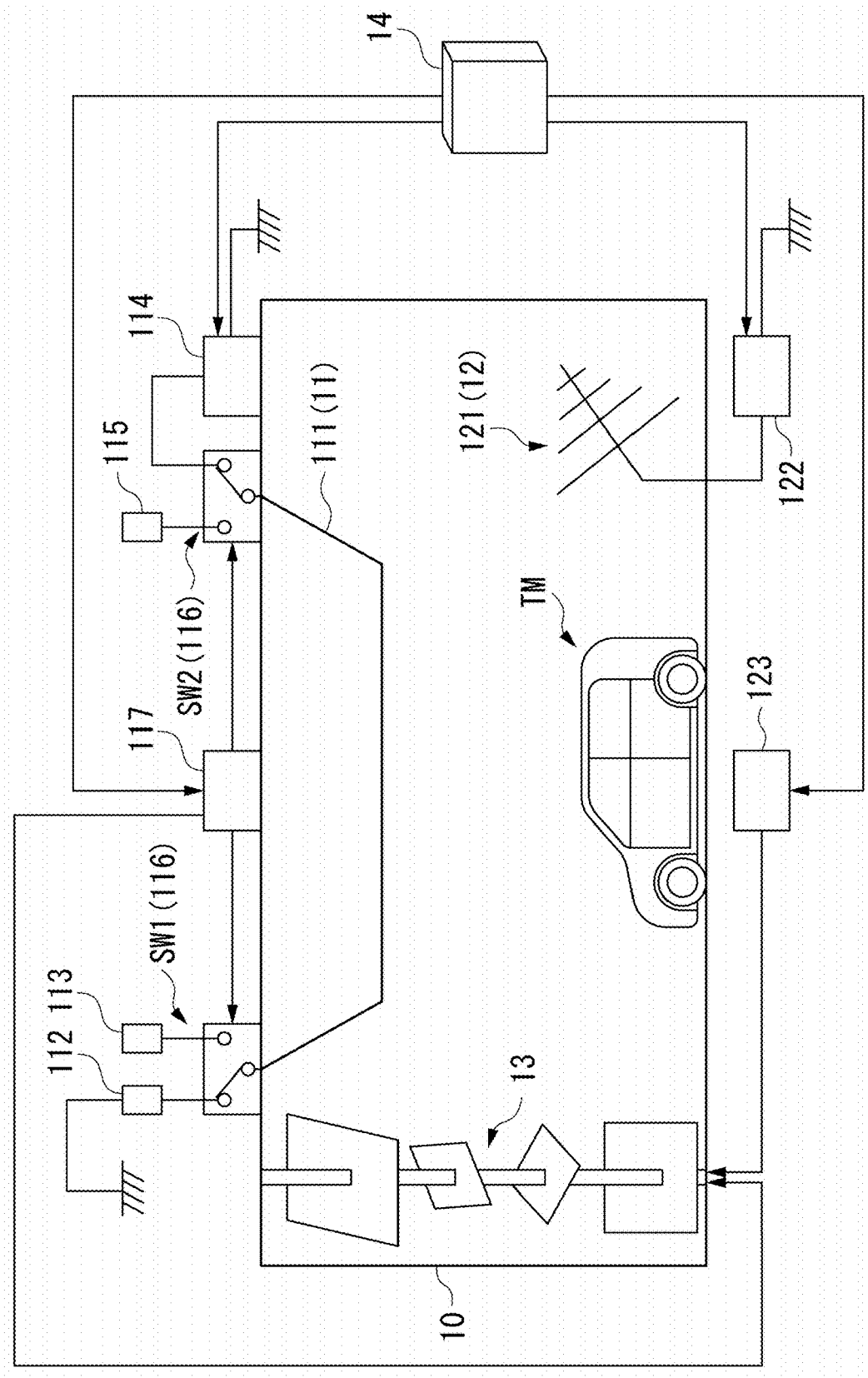
FIG. 1 is a diagram illustrating an example of the configuration of electromagnetic wave test device 1 according to an embodiment.

First, the configuration of electromagnetic wave test device 1 according to an embodiment will be described with reference to FIG. 1. FIG. 1 is a diagram illustrating an example of the configuration of the electromagnetic wave test device 1 according to an embodiment.

A target for performing a radiation immunity test is a test piece TM that is a electric device. And the electromagnetic wave test device 1 is a device performs the radiation immunity test for the test piece TM. For example, the test piece TM is a EUT (Equipment Under Test) or a DUT (Device Under Test). The radiation immunity test is a test for checking whether or not a test piece TM operates normally by applying a uniform electric field having a high intensity to the test piece TM. Hereinafter, as an example, a case in which the test piece TM is a car illustrated in FIG. 1 will be described. The electronic device that is a target for performing a radiation immunity test as the test piece TM, may be any device as long as the device performs electric control. For this reason, the test piece TM may be another device performing electric control such as a drive recorder, a multi-functional mobile phone terminal (a smartphone), a mobile phone terminal, or one various kinds of computers in place of the car.

The electromagnetic wave test device 1 performs a radiation immunity test using a hybrid method. The hybrid method is a method of performing a radiation immunity test by combining a reverberation chamber method and a TLS (Transmission Line System) method. The reverberation chamber method is a method in which a radiation immunity test is performed using a resonance phenomenon inside a reverberation chamber. The TLS method is a method in which a radiation immunity test is performed using a TLS. The TLS is a device that applies an electric field from an antenna such as a TEM (Transverse Electro-Magnetic) plate antenna or a strip line to an electronic device.

The electromagnetic wave test device 1 includes a reverberation chamber 10, a first test device 11, a second test device 12, an electromagnetic stirrer 13, and an information processing device 14.

The reverberation chamber 10 is a cavity resonator that is configured as a casing made of a metal capable of housing a test piece TM. Hereinafter, as an example, a case in which the reverberation chamber 10, as illustrated in FIG. 1, is a cavity resonator, which is made of a metal, having a rectangular parallelepiped shape capable of housing a test piece TM inside will be described. The shape of the reverberation chamber 10 may be another shape capable of housing a test piece TM instead of the rectangular parallelepiped shape. However, the shape of the reverberation chamber 10 is preferably a rectangular parallelepiped shape so that it is easier to calculate a resonance frequency of the reverberation chamber 10. Hereinafter, for the convenience of description, a resonance frequency of the lowest order of the reverberation chamber 10 will be described as a first resonance frequency.

The first test device 11 is a TLS. In other words, in the electromagnetic wave test device 1, the first test device 11 is a device that performs a radiation immunity test according to the TLS method on a test piece TM.

The first test device 11 includes a first antenna 111, a dummy load 112, a first power loss inhibiting unit 113, a first power supply device 114, a second power loss inhibiting unit 115, a switching unit 116, and a first control device 117. In addition, the switching unit 116 includes a first switching unit SW1 and a second switching unit SW2.

The first antenna 111 is an antenna that radiates electromagnetic waves of a frequency that is lower than the first resonance frequency of the reverberation chamber 10. In addition, the first antenna 111 is an antenna that can be used for the TLS. For example, the first antenna 111 is a TEM plate antenna. In addition, the first antenna 111 may be another antenna that can be used for a TLS such as a strip line or a septum in place of the TEM plate antenna. The TEM plate antenna is a device that applies an electric field to a test piece TM by using a parallel flat-plate leaking electric field. The first antenna 111 acquires a RF (Radio Frequency) signal from the first power supply device 114 and radiates electromagnetic waves corresponding to the acquired RF signal. For example, the first antenna 111 is installed on the ceiling of the reverberation chamber to be positioned right above a work area in which a test piece TM is installed in an area of the inside of the reverberation chamber 10. In this case, when the reverberation chamber 10 is seen in the direction of gravity, the first antenna 111 is installed on the ceiling of the reverberation chamber 10 such that it includes the whole work area. In accordance with this, the first antenna 111 can apply an electric field to a test piece TM disposed inside the work area from the ceiling to the floor surface inside the reverberation chamber 10. In addition, the first antenna 111 may be configured to be installed at another position at which an electric field can be applied to the work area.

The dummy load 112 is a resistance element connected between a first ground member having the ground electric potential and the first antenna 111. Hereinafter, as an example, a case in which the impedance of the dummy load 112 matches a characteristic impedance of the first antenna 111 will be described. Although the impedance of the dummy load 112 may not be configured to match the characteristic impedance of the first antenna 111, in a case in which it matches the characteristic impedance of the first antenna 111, the power loss is reduced, which is desirable.

The first power loss inhibiting unit 113 is a member that inhibits an increase in the power loss in accordance with a part of electromagnetic waves radiated from the second antenna 121 being received by the first antenna 111 in a case in which a radiation immunity test according to the reverberation chamber method is performed by the second test device 12. More specifically, the first power loss inhibiting unit 113 is a member having an impedance corresponding to an allowed value of power loss according to the first antenna 111 in this case. Details of the first power loss inhibiting unit 113 will be described below. In addition, the power loss according to the first antenna 111 in this case may be configured to be represented by electric power consumed by the first antenna 111 in this case or may be represented by an amount of decrease in the electric field intensity of the inside of the reverberation chamber 10 according to the first antenna 111 in this case.

The first power supply device 114 is a power supply device that feeds power to the first antenna 111. More specifically, the first power supply device 114 outputs an RF signal of a frequency lower than the first resonance frequency of the reverberation chamber 10 to the first antenna 111. In the example illustrated in FIG. 1, the first power supply device 114 is controlled by the information processing device 14. In this case, the first power supply device 114 may have any configuration as long as an RF signal of the frequency according to a request from the information processing device 14 can be output to the first antenna 111. In addition, instead of the configuration controlled by the information processing device 14, the first power supply device 114 may be configured to include an operation unit that accepts an operation from a user and to be able to output an RF signal of the frequency according to the operation accepted from the operation unit to the first antenna 111. The first power supply device 114 is connected between a second ground member having the ground electric potential and the first antenna 111. In addition, the second ground member may be the same member as the first ground member or may be a member different from the first ground member.

The second power loss inhibiting unit 115 is a member that inhibits an increase in the power loss in accordance with a part of electromagnetic waves radiated from the second antenna 121 being received by the first antenna 111 in a case in which a radiation immunity test according to the reverberation chamber method is performed by the second test device 12. More specifically, the second power loss inhibiting unit 115 is a member having an impedance corresponding to an allowed value of power loss according to the first antenna 111 in this case. Details of the second power loss inhibiting unit 115 will be described below. In addition, the second power loss inhibiting unit 115 may be configured integrally with the first power loss inhibiting unit 113. Hereinafter, as an example, a case in which the second power loss inhibiting unit 115 is separate from the first power loss inhibiting unit 113 will be described.

The first switching unit SW1 is a device that switches a connection destination of the first antenna 111 to one of the dummy load 112 and the first power loss inhibiting unit 113. The first switching unit SW1 may have any configuration as long as the configuration is able to switch a connection destination of the first antenna 111 to any one of the dummy load 112 and the first power loss inhibiting unit 113. In the example illustrated in FIG. 1, the first switching unit SW1 is a switching element (for example, a relay switch, a field effect transistor, or the like) that switches the connection destination of the first antenna 111 to one of the dummy load 112 and the first power loss inhibiting unit 113 in accordance with a request from the first control device 117. In addition, the first switching unit SW1 may be configured to include an operation unit accepting an operation for switching the connection destination of the first antenna 111 to one of the dummy load 112 and the first power loss inhibiting unit 113 and to switch the connection destination of the first antenna 111 to one of the dummy load 112 and the first power loss inhibiting unit 113 in accordance with the operation accepted from the operation unit. In such a case, for example, the operation unit is a button, a lever, or the like but is not limited thereto.

The second switching unit SW2 is a device that switches the connection destination of the first antenna 111 to one of the first power supply device 114 and the second power loss inhibiting unit 115. The second switching unit SW2 may have any configuration as long as the configuration is able to switch the connection destination of the first antenna 111 to any one of the first power supply device 114 and the second power loss inhibiting unit 115. In the example illustrated in FIG. 1, the second switching unit SW2 is a switching element (for example, a relay switch, a field effect transistor, or the like) that switches the connection destination of the first antenna 111 to one of the first power supply device 114 and the second power loss inhibiting unit 115 in accordance with a request from the first control device 117. In addition, the second switching unit SW2 may be configured to include an operation unit accepting an operation for switching the connection destination of the first antenna 111 to one of the first power supply device 114 and the second power loss inhibiting unit 115 and to switch the connection destination of the first antenna 111 to one of the first power supply device 114 and the second power loss inhibiting unit 115 in accordance with the operation accepted from the operation unit. In such a case, for example, the operation unit is a button, a lever, or the like but is not limited thereto.

The first control device 117 is a device that causes the switching unit 116 to perform switching of the connection. More specifically, the first control device 117 causes the connection destination of the first antenna 111 to be switched to one of the dummy load 112 and the first power loss inhibiting unit 113 by controlling the first switching unit SW1. In addition, the first control device 117 causes the connection destination of the first antenna 111 to be switched to one of the first power supply device 114 and the second power loss inhibiting unit 115 by controlling the second switching unit SW2. In the example illustrated in FIG. 1, the first control device 117 causes the switching unit 116 to perform such switching of the connection in accordance with a request from the information processing device 14. In addition, the first control device 117 may be configured to include an operation unit accepting an operation for causing the switching unit 116 to perform switching of connection and to cause the switching unit 116 to perform switching of the connection in accordance with the operation accepted from the operation unit.

In addition, the first control device 117 controls the electromagnetic stirrer 13 as well. In the example illustrated in FIG. 1, the first control device 117 rotates the electromagnetic stirrer 13 by controlling the electromagnetic stirrer 13. In accordance with this, the first control device 117 can cause the electromagnetic stirrer 13 to stir electromagnetic waves of the inside of the reverberation chamber 10. In the example illustrated in FIG. 1, the first control device 117 performs control of the electromagnetic stirrer 13 in accordance with a request from the information processing device 14. In addition, the first control device 117 may be configured to include an operation unit accepting an operation for performing control of the electromagnetic stirrer 13 and to perform control of the electromagnetic stirrer 13 in accordance with the operation accepted from the operation unit. Furthermore, the first control device 117 may be configured integrally with the information processing device 14.

The second test device 12 is a device that performs a radiation immunity test according to the reverberation chamber method on a test piece TM.

The second test device 12 includes a second antenna 121, a second power supply device 122, and a second control device 123.

The second antenna 121 is an antenna that radiates electromagnetic waves of a frequency that is equal to or higher than the first resonance frequency of the reverberation chamber 10. In addition, the second antenna 121 may be an antenna of any configuration as long as it is an antenna capable of radiating the electromagnetic waves. The second antenna 121 acquires an RF signal from the second power supply device 122 and radiates electromagnetic waves corresponding to the acquired RF signal. The second antenna 121 is installed inside the reverberation chamber 10. A position at which the second antenna 121 is installed inside the reverberation chamber 10 may be any position as long as it is a position of an area outside of the work area described above in the area of the inside of the reverberation chamber 10. The second antenna 121 acquires an RF signal from the second power supply device 122 and radiates electromagnetic waves corresponding to the acquired RF signal.

The second power supply device 122 is a power supply device that feeds power to the second antenna 121. More specifically, the second power supply device 122 outputs an RF signal of a frequency equal to or higher than the first resonance frequency of the reverberation chamber 10 to the second antenna 121. In the example illustrated in FIG. 1, the second power supply device 122 is controlled by the information processing device 14. In this case, the second power supply device 122 may have any configuration as long as it is a configuration being able to output an RF signal of a frequency according to a request from the information processing device 14 to the second antenna 121. In addition, instead of the configuration controlled by the information processing device 14, the second power supply device 122 may be configured to include an operation unit that accepts an operation from a user and to be able to output an RF signal of the frequency according to the operation accepted from the operation unit to the second antenna 121. The second power supply device 122 is connected between a third ground member having the ground electric potential and the second antenna 121. In addition, the third ground member may be the same member as the first ground member or may be a member different from the first ground member. Furthermore, the third ground member may be the same member as the second ground member or may be a member different from the second ground member.

The second control device 123 is a control device that controls the electromagnetic stirrer 13. In the example illustrated in FIG. 1, the second control device 123 rotates the electromagnetic stirrer 13 by controlling the electromagnetic stirrer 13. In accordance with this, the second control device 123 can cause the electromagnetic stirrer 13 to stir electromagnetic waves of the inside of the reverberation chamber 10. In the example illustrated in FIG. 1, the second control device 123 performs control of the electromagnetic stirrer 13 in accordance with a request from the information processing device 14. In addition, the second control device 123 may be configured to include an operation unit accepting an operation for performing control of the electromagnetic stirrer 13 and to perform control of the electromagnetic stirrer 13 in accordance with the operation accepted from the operation unit. Furthermore, the second control device 123 may be configured integrally with one or both of the first control device 117 and the information processing device 14.

The electromagnetic stirrer 13 is installed inside the reverberation chamber 10 and stirs electromagnetic waves of the inside of the reverberation chamber 10. In accordance with this, the reverberation chamber 10 can decrease variations of the electric field intensity of the inside of the work area described above. The electromagnetic stirrer 13 may have any configuration as long as it is a configuration being able to stir electromagnetic waves of the inside of the reverberation chamber 10. In the example illustrated in FIG. 1, the electromagnetic stirrer 13 includes a shaft body, four stirring blades having a flat plate rectangular shape disposed in the shaft body to be aligned along the shaft body, and a drive unit rotating the shaft body. In this case, the electromagnetic stirrer 13 is controlled by the first control device 117 and the second control device 123 and stirs electromagnetic waves of the inside of the reverberation chamber 10 using the four stirring blades rotating together with the shaft body. Thus, each of the first control device 117 and the second control device 123 rotates the shaft body by controlling the drive unit. In addition, the electromagnetic stirrer 13 may be configured to be provided in the first test device 11 or may be configured to be provided in the second test device 12.

The information processing device 14 controls the first power supply device 114, the first control device 117, the second power supply device 122, and the second control device 123 in accordance with an operation accepted from a user. The information processing device 14, for example, is an information processing device such as a laptop PC (Personal Computer), a desktop PC, a workstation, a tablet PC, a multi-functional mobile phone terminal, a mobile phone terminal, or a personal digital assistant (PDA) but is not limited thereto.

The information processing device 14 is connected to the first power supply device 114, the first control device 117, the second power supply device 122, and the second control device 123 in a wired or wireless manner such that it can communicate therewith. However, from characteristics of a radiation immunity test, it is preferable that the information processing device 14 be connected to the first power supply device 114, the first control device 117, the second power supply device 122, and the second control device 123 using wires such that it can communication therewith.

<Power Loss Occurring According to First Antenna in Reverberation Chamber Method>

Hereinafter, power loss occurring according to the first antenna 111 in the reverberation chamber method will be described.

In the reverberation chamber method, the electromagnetic wave test device 1 radiates electromagnetic waves of the first resonance frequency or higher from the second antenna 121. In accordance with this, the electromagnetic wave test device 1 generates an electric field applied to a test piece TM in accordance with a resonance phenomenon of electromagnetic waves of the inside of the reverberation chamber 10. At this time, the first antenna 111 receives the electromagnetic waves of the inside of the reverberation chamber 10.

In a case in which the electromagnetic waves of the inside of the reverberation chamber 10 are received by the first antenna 111 and in a case in which the first antenna 111 is connected to at least one member among the first power supply device 114 and the dummy load 112, the first antenna 111 causes a current to flow to a member having the ground electric potential through this member. For this reason, in the electromagnetic wave test device 1, power loss according to the first antenna 111 in a case in which a radiation immunity test according to the reverberation chamber method is performed can be represented using a reception power ratio. The reception power ratio is a ratio between an electric power input to the second antenna 121 as an RF signal and an electric power received by the first antenna 111 (in other words, a power consumed by the first antenna 111).

Figure 2:
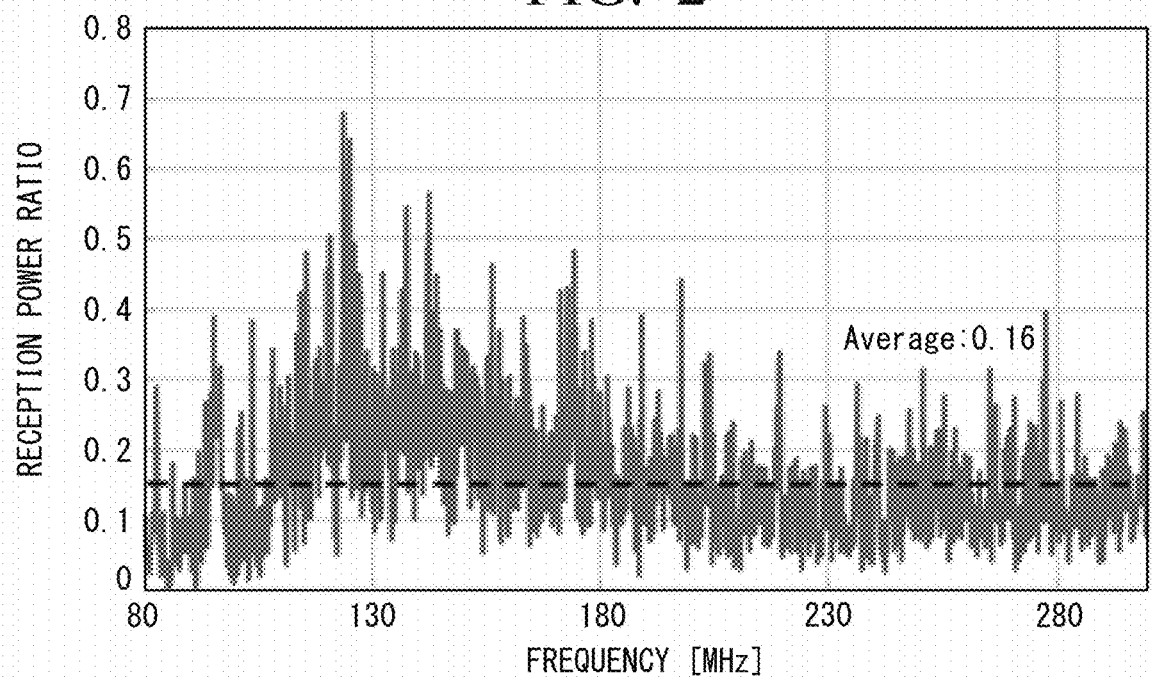
FIG. 2 is a diagram illustrating an example of a change in a reception power ratio with respect to a change in the frequency of an RF signal input to a second antenna 121.

Here, FIG. 2 is a diagram illustrating an example of a change of the reception power ratio with respect to a change of the frequency of an RF signal input to the second antenna 121. Here, FIG. 2 is an example of results of measurement of the reception power ratio of a case in which only the dummy load 112 is connected to the first antenna 111, and electromagnetic waves are radiated from the second antenna 121, while the frequency is changed. A vertical axis of a graph illustrated in FIG. 2 represents a reception power ratio. In addition, a horizontal axis of the graph represents a frequency of an RF signal input to the second antenna 121. In the example illustrated in FIG. 2, a frequency average of the reception power ratio is 0.16. In other words, FIG. 2 illustrates that a power of 16% of an electric power input to the second antenna 121 as an RF signal is lost in the electromagnetic wave test device 1 of a case in which only the dummy load 112 is connected to the first antenna 111. In addition, although not illustrated in the drawing, also in the electromagnetic wave test device 1 of a case in which only the first power supply device 114 is connected to the first antenna 111, a frequency average of the reception power ratio is measured to be about 0.16. In the electromagnetic wave test device 1 of a case in which both the dummy load 112 and the first power supply device 114 are connected to the first antenna 111, the frequency average of the reception power ratio is measured to be about 0.32. Intuitively, this is considered to be a result according to a path in which a current flows from the first antenna 111 being doubled. Thus, in the electromagnetic wave test device 1, it is known that an electric power of about 32% of an electric power input to the second antenna 121 as an RF signal is lost in this case.

On the other hand, in a case in which electromagnetic waves of the inside of the reverberation chamber 10 is received by the first antenna 111, the first antenna 111 lowers the electric field intensity of the inside of the reverberation chamber 10. For this reason, in the electromagnetic wave test device 1, power loss according to the first antenna 111 of a case in which a radiation immunity test according to the reverberation chamber method is performed can be represented also using an electric field intensity ratio. The electric field intensity ratio is a ratio of the electric field intensity of the inside of the reverberation chamber 10 of a case in which electromagnetic waves are radiated from the second antenna 121 inside the reverberation chamber 10 that is in a first antenna installed state with respect to an electric field intensity of the inside of the reverberation chamber 10 of a case in which electromagnetic waves are radiated from the second antenna 121 inside the reverberation chamber 10 that is in a first antenna uninstalled state. The first antenna uninstalled state is a state in which the first antenna 111 is not installed among states of the reverberation chamber 10. In addition, the first antenna installed state is a state in which the first antenna 111 is installed, and the dummy load 112 and the first power supply device 114 are installed in the first antenna 111 among states of the reverberation chamber 10.

Figure 3:
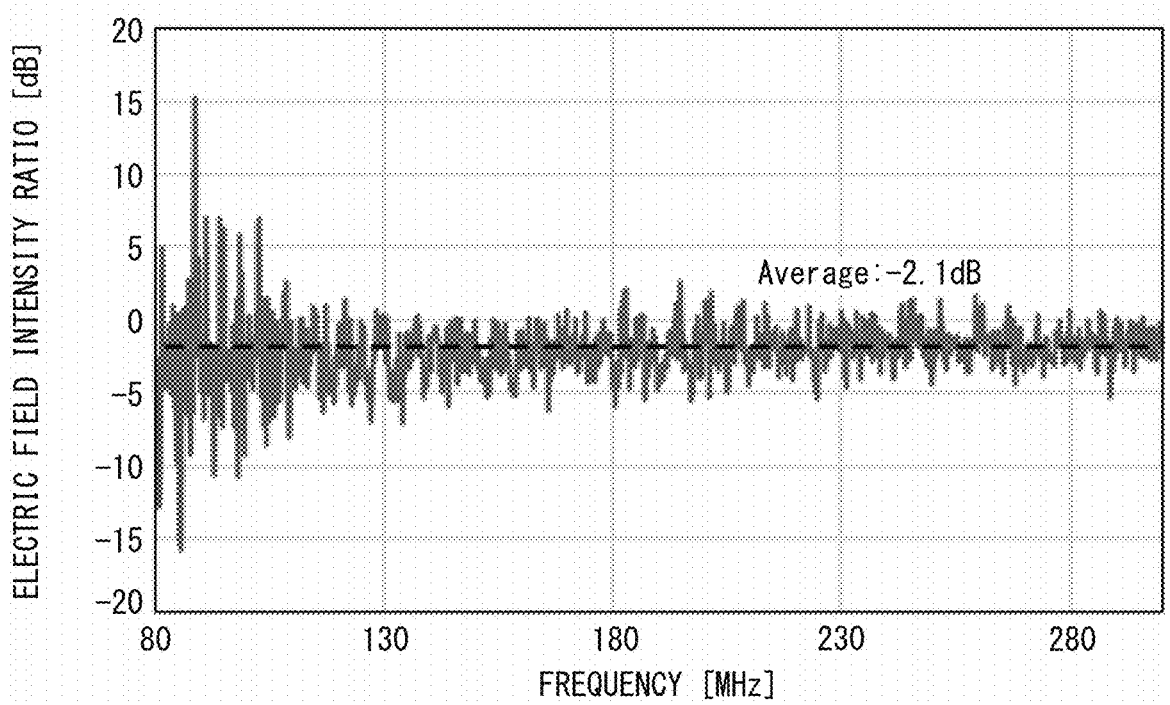
FIG. 3 is a diagram illustrating an example of a change in an electric field intensity ratio with respect to a change in the frequency of an RF signal input to the second antenna 121.

Here, FIG. 3 is a diagram illustrating an example of a change of the electric field intensity ratio with respect to a change of the frequency of an RF signal input to the second antenna 121. In FIG. 3, the electric field intensity ratio is represented using a deviation. A vertical axis of a graph illustrated in FIG. 3 represents an electric field intensity ratio represented using the deviation. In addition, a horizontal axis of the graph represents the frequency of the RF signal input to the second antenna 121. In the example illustrated in FIG. 3, the frequency average of the electric field intensity ratio is −2.1 [dB]. This represents that the electric field intensity of the inside of the reverberation chamber 10 of a case in which electromagnetic waves are radiated from the second antenna 121 inside the reverberation chamber 10 that is in the first antenna installed state is lower than the electric field intensity of the inside of the reverberation chamber 10 of a case in which electromagnetic waves are radiated from the second antenna 121 inside the reverberation chamber 10 that is in the first antenna uninstalled state by about 20[%]. In other words, this represents that, in the electromagnetic wave test device 1 of a case in which both the dummy load 112 and the first power supply device 114 are connected to the first antenna 111, 20[%] of the electric field generated inside the reverberation chamber 10 in accordance with radiation of electromagnetic waves from the second antenna 121 is lost in accordance with the first antenna 111 as an electric power.

As above, power loss according to the first antenna 111 in a case in which a radiation immunity test according to the reverberation chamber method is performed can be represented using each of the reception power ratio and the electric field intensity ratio. The cause of such power loss is the first antenna 111 causing a current to flow to a member having the ground electric potential through each of the dummy load 112 and the first power supply device 114. Thus, in this case, the electromagnetic wave test device 1 switches the connection destination of the first antenna 111 from the dummy load 112 and the first power supply device 114 to the first power loss inhibiting unit 113 and the second power loss inhibiting unit 115 by controlling the switching unit 116. In accordance with this, in a radiation immunity test according to the reverberation chamber method among radiation immunity tests according to the hybrid method, the electromagnetic wave test device 1 can inhibit an increase of power loss according to the first antenna 111. In other words, the electromagnetic wave test device 1 can inhibit an increase of power loss according to the first antenna 111 in a radiation immunity test according to the hybrid method. The reason for this is that each of the first power loss inhibiting unit 113 and the second power loss inhibiting unit 115 inhibits an increase of the power loss according to the first antenna 111. Thus, hereinafter, the reason that each of the first power loss inhibiting unit 113 and the second power loss inhibiting unit 115 inhibits an increase of the power loss according to the first antenna 111 will be described.

<Reason for Power Loss According to First Antenna Inhibited>

Hereinafter, the reason that each of the first power loss inhibiting unit 113 and the second power loss inhibiting unit 115 inhibits an increase of the power loss according to the first antenna 111 will be described. Hereinafter, for description of this reason, a case in which each of the dummy load 112, the first power supply device 114, the first power loss inhibiting unit 113, and the second power loss inhibiting unit 115 is not connected to the first antenna 111, and a resistance element X having an impedance represented by a variable Z is connected between the first antenna 111 and a member having the ground electric potential will be described. In this case, the reception power ratio and the electric field intensity ratio described above change in accordance with the value of Z. In addition, hereinafter, as an example, a case in which the characteristic impedance $Z_0$ of the first antenna 111 is 50[Ω] will be described.

Figure 4:
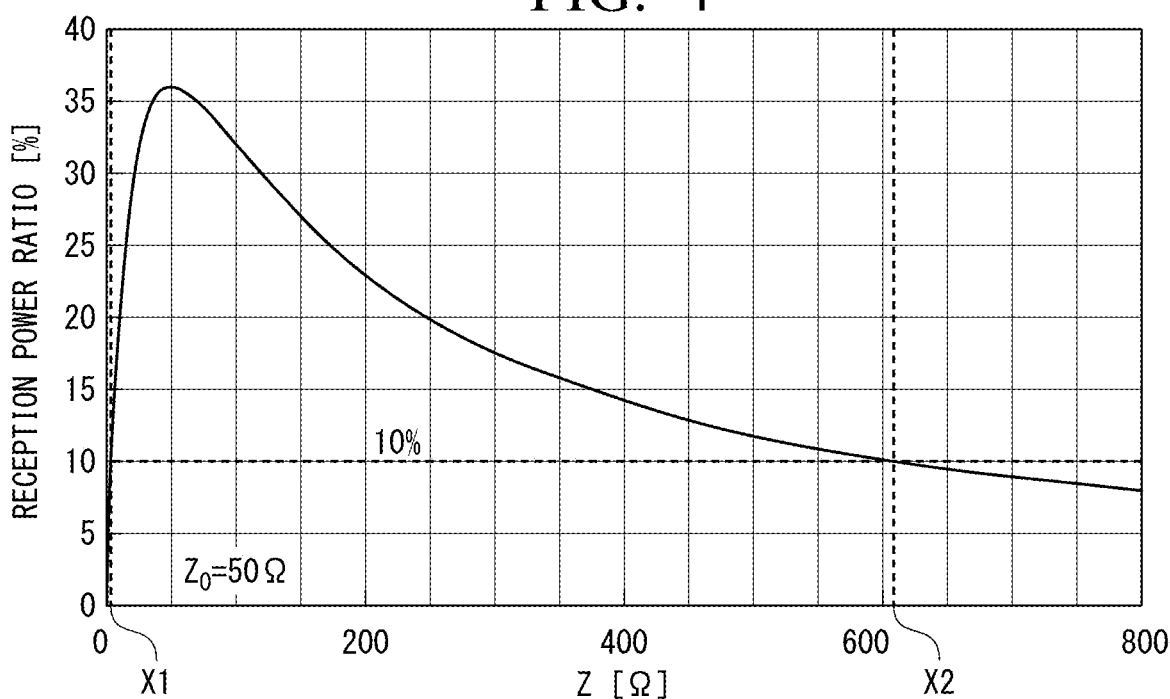
FIG. 4 is a diagram illustrating an example of a change in a reception power ratio in a case in which Z is changed.

FIG. 4 is a diagram illustrating an example of a change of the reception power ratio acquired in a case in which Z is changed. In FIG. 4, the reception power ratio is represented using a percentage. A vertical axis of a graph illustrated in FIG. 4 represents the reception power ratio represented using a percentage. In addition, a horizontal axis of this graph represents the value of Z. A curve plotted on this graph is a curve of the reception power ratio that is calculated theoretically. In the example illustrated in FIG. 4, the reception power ratio becomes a maximum in a case in which Z is 50[Ω]. The reason for this is that, in this example, in a case in which Z is 50[Ω], the characteristic impedance of the first antenna 111 and the impedance of the resistance element X match each other. In this case, the reception power ratio becomes lower as Z becomes further lower than 50[Ω] and becomes lower as Z becomes further higher than 50[Ω]. Here, by acquiring this graph through an in-advance experiment or the like, a manufacturer of the electromagnetic wave test device 1 can determine the value of Z such that the reception power ratio is a first allowed value determined in advance or less. For example, when this graph is regarded as a graph acquired through an in-advance experiment or the like, and the first allowed value is set to 10[%], the manufacturer can determine the value of Z to be a value equal to or less than X1 or a value equal to or more than X2. X1 is a smaller value among two values of Z for which the reception power ratio is 10[%] in this graph and is 4[Ω]. In addition, X2 is s larger value among two values of Z for which the reception power ratio is 10[%] in this graph and is 615 [Ω].

Thus, in a case in which each of the first power loss inhibiting unit 113 and the second power loss inhibiting unit 115 is connected to the first antenna 111 in place of the resistance element X, and in a case in which a combined impedance of the impedance of the first power loss inhibiting unit 113 and the impedance of the second power loss inhibiting unit 115 is a first impedance I11 equal to or lower than X1, when a radiation immunity test according to the reverberation chamber method is performed, the electromagnetic wave test device 1 can suppress the reception power ratio to be the first allowed value or less. In addition, in a case in which each of the first power loss inhibiting unit 113 and the second power loss inhibiting unit 115 is connected to the first antenna 111 in place of the resistance element X and also in a case in which the combined impedance is a second impedance I12 that is X2 or more, when a radiation immunity test according to the reverberation chamber method is performed, the electromagnetic wave test device 1 can suppress the reception power ratio to be the first allowed value or less. In other words, in a radiation immunity test according to the hybrid method, the electromagnetic wave test device 1 can inhibit an increase of the power loss.

In addition, in a case in which the first power loss inhibiting unit 113 is connected to the first antenna 111 in place of the resistance element X (in other words, in a case in which the first power loss inhibiting unit 113 is connected to the first antenna 111, and the second power loss inhibiting unit 115 is not connected to the first antenna 111), by setting the impedance of the first power loss inhibiting unit 113 to the first impedance I11 or the second impedance I12, the electromagnetic wave test device 1 can suppress the reception power ratio to be the first allowed value or less in a radiation immunity test according to the reverberation chamber method. In addition, in a case in which the second power loss inhibiting unit 115 is connected to the first antenna 111 in place of the resistance element X (in other words, in a case in which the second power loss inhibiting unit 115 is connected to the first antenna 111, and the first power loss inhibiting unit 113 is not connected to the first antenna 111), by setting the impedance of the second power loss inhibiting unit 115 to the first impedance I11 or the second impedance I12, the electromagnetic wave test device 1 can suppress the reception power ratio to be the first allowed value or less in a radiation immunity test according to the reverberation chamber method. Thus, also in a case in which any one of the first power loss inhibiting unit 113 and the second power loss inhibiting unit 115 is connected to the first antenna 111 in place of the resistance element X, the electromagnetic wave test device 1 can suppress the power loss represented by the reception power ratio as power loss according to the first antenna 111 to be the first allowed value or less.

Figure 5:
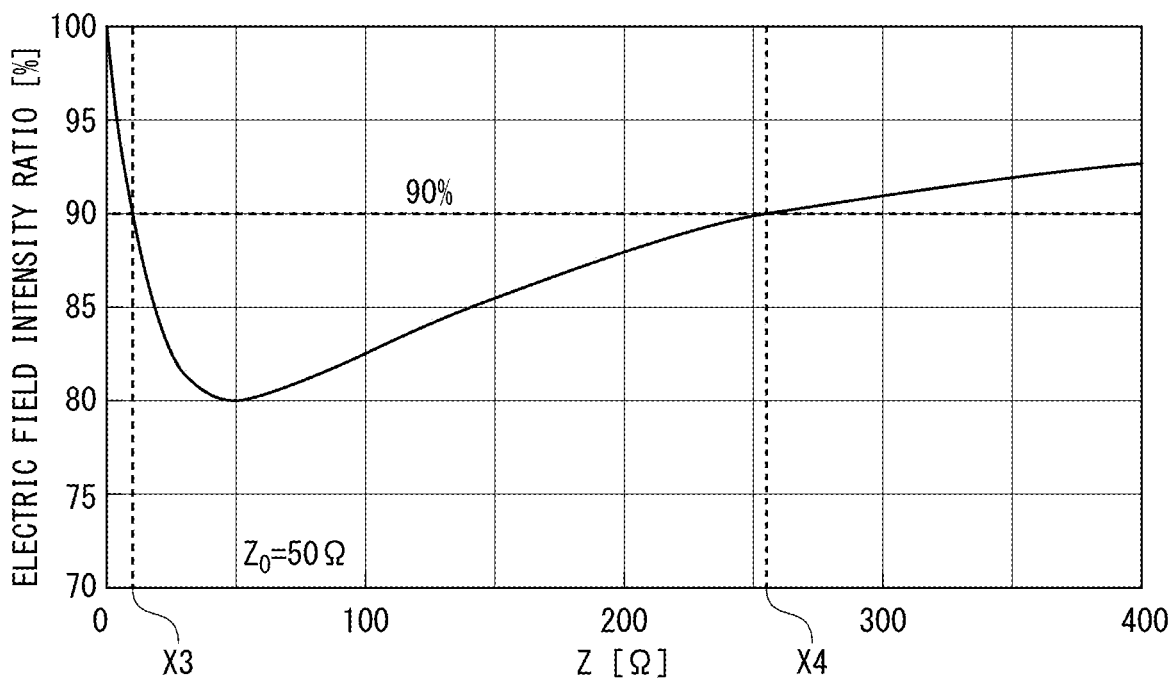
FIG. 5 is a diagram illustrating an example of a change in an electric field intensity ratio in a case in which Z is changed.

On the other hand, FIG. 5 is a diagram illustrating an example of a change of the electric field intensity ratio acquired in a case in which Z is changed. In FIG. 5, the electric field intensity ratio is represented using a percentage. A vertical axis of a graph illustrated in FIG. 5 represents the electric field intensity ratio represented using a percentage. In addition, a horizontal axis of this graph represents the value of Z. A curve plotted on this graph is a curve of the electric field intensity ratio that is calculated theoretically. In the example illustrated in FIG. 5, the electric field intensity ratio becomes a minimum in a case in which Z is 50[Ω]. As described above, the reason for this is that, in this example, in a case in which Z is 50[Ω], the characteristic impedance of the first antenna 111 and the impedance of the resistance element X match each other. In this case, the electric field intensity ratio becomes higher as Z becomes further lower than 50[Ω] and becomes higher as Z becomes further higher than 50[Ω]. Here, by acquiring this graph through an in-advance experiment or the like, a manufacturer of the electromagnetic wave test device 1 can determine the value of Z such that the electric field intensity ratio is a second allowed value determined in advance or more. For example, when this graph is regarded as a graph acquired through an in-advance experiment or the like, and the second allowed value is set to 90[%], the manufacturer can determine the value of Z to be a value equal to or less than X3 or a value equal to or more than X4. In the example illustrated in FIG. 5, X3 is a smaller value among two values of Z for which the electric field intensity ratio is 90[%] and is 9[Ω]. In addition, in the example illustrated in FIG. 5, X4 is a larger value among two values of Z for which the electric field intensity ratio is 90[%] and is 255 [Ω].

Thus, in a case in which each of the first power loss inhibiting unit 113 and the second power loss inhibiting unit 115 is connected to the first antenna 111 in place of the resistance element X, and in a case in which a combined impedance of the impedance of the first power loss inhibiting unit 113 and the impedance of the second power loss inhibiting unit 115 is a first impedance I21 equal to or lower than X3, when a radiation immunity test according to the reverberation chamber method is performed, the electromagnetic wave test device 1 can suppress the power loss represented by the electric field intensity ratio as the power loss according to the first antenna 111 to be the second allowed value or more. In addition, in a case in which each of the first power loss inhibiting unit 113 and the second power loss inhibiting unit 115 is connected to the first antenna 11l in place of the resistance element X and also in a case in which the combined impedance is a second impedance I22 that is X4 or more, when a radiation immunity test according to the reverberation chamber method is performed, the electromagnetic wave test device 1 can suppress the power loss represented by the electric field intensity ratio as the power loss according to the first antenna 111 to be the second allowed value or more. In other words, in a radiation immunity test according to the hybrid method, the electromagnetic wave test device 1 can inhibit an increase of the power loss.

In addition, in a case in which the first power loss inhibiting unit 113 is connected to the first antenna 111 in place of the resistance element X (in other words, in a case in which the first power loss inhibiting unit 113 is connected to the first antenna 111, and the second power loss inhibiting unit 115 is not connected to the first antenna 111), by setting the impedance of the first power loss inhibiting unit 113 to the first impedance I21 or the second impedance I22, the electromagnetic wave test device 1 can suppress the electric field intensity ratio to be the second allowed value or more in a radiation immunity test according to the reverberation chamber method. In addition, in a case in which the second power loss inhibiting unit 115 is connected to the first antenna 111 in place of the resistance element X (in other words, in a case in which the second power loss inhibiting unit 115 is connected to the first antenna 111, and the first power loss inhibiting unit 113 is not connected to the first antenna 111), by setting the impedance of the second power loss inhibiting unit 115 to the first impedance I21 or the second impedance I22, the electromagnetic wave test device 1 can suppress the electric field intensity ratio to be the second allowed value or more in a radiation immunity test according to the reverberation chamber method. Thus, also in a case in which any one of the first power loss inhibiting unit 113 and the second power loss inhibiting unit 115 is connected to the first antenna 111, the electromagnetic wave test device 1 can suppress the power loss represented by the electric field intensity ratio as power loss according to the first antenna 111 to be the second allowed value or more.

Here, when a combined impedance of the impedance of the first power loss inhibiting unit 113 and the impedance of the second power loss inhibiting unit 115 is set to the first impedance I11 or the first impedance I21, the first power loss inhibiting unit 113 and the second power loss inhibiting unit 115 may be resistance elements having impedances such that this combined impedance is the first impedance I11 or the first impedance I21, may be other circuit elements having impedances such that this combined impedance is the first impedance I11 or the first impedance I21, or may be fourth ground members having the ground electric potential. The fourth ground member may be a member that is the same as at least one of the first ground member to the third ground member or may be a member different from all the first to third ground members. When this combined impedance of the impedance is set to the second impedance I12 or the second impedance I22, the first power loss inhibiting unit 113 and the second power loss inhibiting unit 115 may be resistance elements having impedances such that this combined impedance is the second impedance I12 or the second impedance I22, may be other circuit elements having impedances such that this combined impedance is the second impedance I12 or the second impedance I22, or may be open ends. By configuring as such, the first power loss inhibiting unit 113 and the second power loss inhibiting unit 115 can inhibit an increase of power loss according to the first antenna 111.

In addition, in a case in which the impedance of the first power loss inhibiting unit 113 is set to the first impedance I11 or the first impedance I21, the first power loss inhibiting unit 113 may be a resistance element having the first impedance I11 or the first impedance I21, may be other circuit elements having impedances such that the combined impedance thereof is the first impedance I11 or the first impedance I21, or may be a fourth ground member having the ground electric potential. The fourth ground member may be a member that is the same as at least one of the first ground member to the third ground member or may be a member different from all the first to third ground members. In addition, in a case in which the impedance of the first power loss inhibiting unit 113 is set to the second impedance I12 or the second impedance I22, the first power loss inhibiting unit 113 may be a resistance element having the second impedance I12 or the second impedance I22, may be other circuit elements having impedances such that the combined impedance thereof is the second impedance I12 or the second impedance I22, or may be an open end. By configuring as such, the first power loss inhibiting unit 113 can inhibit an increase of power loss according to the first antenna 111.

In addition, in a case in which the impedance of the second power loss inhibiting unit 115 is set to the first impedance I11 or the first impedance I21, the second power loss inhibiting unit 115 may be a resistance element having the first impedance I11 or the first impedance I21, may be other circuit elements having impedances such that the combined impedance thereof is the first impedance I11 or the first impedance I21, or may be a fifth ground member having the ground electric potential. The fifth ground member may be a member that is the same as at least one of the first ground member to the fourth ground member or may be a member different from all the first to fourth ground members. In addition, in a case in which the impedance of the second power loss inhibiting unit 115 is set to the second impedance I12 or the second impedance I22, the second power loss inhibiting unit 115 may be a resistance element having the second impedance I12 or the second impedance I22, may be other circuit elements having impedances such that the combined impedance thereof is the second impedance I12 or the second impedance I22, or may be an open end. By configuring as such, the second power loss inhibiting unit 115 can inhibit an increase of power loss according to the first antenna 111.

As above, by including the first power loss inhibiting unit 113 and the second power loss inhibiting unit 115 in place of the resistance element X and including the switching unit 116, the electromagnetic wave test device 1 can inhibit an increase of the power loss in a radiation immunity test according to the hybrid method. In addition, the method of determining the first impedance I11, the second impedance I12, the first impedance I21, and the second impedance I22 described above is a method for acquiring the graphs represented in FIGS. 4 and 5 through an in-advance experiment or the like but is not a method that can be used in a design stage. Thus, as a method for determining X3 and X4 among X1 to X4 described above, a method using a theoretical formula may be employed. In such a method, X3 can be specified as a first threshold for Z (in other words, a first threshold for the first impedance I21), and X4 can be specified as a second threshold for Z (in other words, a second threshold for the second threshold impedance 122) from a design stage, and thus the method has versatility higher than a method using gauging and is useful. In addition, in the method of determining the first threshold and the second threshold using this theoretical formula, conditions to be satisfied by a combined impedance of the impedance of the first power loss inhibiting unit 113 and the impedance of the second power loss inhibiting unit 115, as an impedance for suppressing power loss represented by the electric field intensity ratio as power loss according to the first antenna 111 to be the second allowed value or more can be acquired. Hereinafter, for the convenience of description, the combined impedance of the impedance of the first power loss inhibiting unit 113 and the impedance of the second power loss inhibiting unit 115 will be simply referred to as a combined impedance in description.

<Method for Determining First Threshold and Second Threshold from Theoretical Formula>

Hereinafter, a method for determining the first threshold and the second threshold from a theoretical formula will be described. Also here, for description of this method, a case in which each of the dummy load 112, the first power supply device 114, the first power loss inhibiting unit 113, and the second power loss inhibiting unit 115 is not connected to the first antenna 111, and only the resistance element X having an impedance represented by a variable Z is connected to the first antenna 111 will be described. In addition, a case in which the resistance element X is further connected to a member having the ground electric potential will be described. Also hereinafter, as an example, a case in which the characteristic impedance $Z_0$ of the first antenna 111 is 50 [Ω] will be described. In addition, hereinafter, for the convenience of description, a normalized impedance acquired by normalizing Z using $Z_0$ will be denoted by Z'.

First, according to electromagnetics, a reflection coefficient r according to mismatching between the characteristic impedance of the first antenna 111 and the impedance of the resistance element X is represented using Z' as in the following Equation (1).

$$\Gamma = \frac{|Z'-1|}{|Z'+1|} \tag{1}$$

For this reason, a transmission power coefficient S for an electric power transmitted from the first antenna 111 to the resistance element X is represented as in the following Equation (2) using the reflection coefficient Γ.

$$S = 1 - \Gamma^2 \tag{2}$$

A consumption power ratio $r_{loss}$ is represented as in the following Equation (3) using a reception power ratio $r_p$ and the transmission power coefficient S of a case of Γ=0 (in other words, power loss according to the first antenna 111 becomes a maximum).

$$r_{loss} = S \cdot r_P \tag{3}$$

However, in a case in which there are two paths in which a current flows from the first antenna 111 (in other words, the first antenna 111 is connected to the first antenna 111 and the first power supply device 114), as described above, the reception power ratio $r_p$ becomes double. For this reason, in this case, the consumption power ratio $r_{loss}$ of the first antenna 111 becomes double as well. Thus, an effective power ratio $r_{Pnet}$ is represented as in the following Equation (4).

$$r_{Pnet} = 1 - 2r_{loss} \tag{4}$$

Here, in the reverberation chamber method, the reverberation chamber 10 generates an electric field having a uniform intensity inside the reverberation chamber 10 in accordance with a resonance phenomenon. Thus, when it is assumed that an electric field of a uniform intensity is applied to each of the wall face of the reverberation chamber 10 and the first antenna 111, based on consideration of an effective area of the antenna, it can be conceived that an electric power received by the wall face of the reverberation chamber 10 is in proportion to the surface area of the wall face, and an electric power received by the first antenna 111 is in proportion to the surface area of the first antenna 111. As a result, Equation (4) described above can be rewritten to be scalable as in the following Equation (5) based on a first area ratio $r_{S\_ref}$ and a second area ratio $r_S$. Here, the first area ratio $r_{S\_ref}$ is a ratio of the surface area of the first antenna 111 to the surface area of the reverberation chamber having a reference reception power ratio. The second area ratio is a ratio of the surface area of the first antenna 111 to the surface area of the reverberation chamber that is a target for determining the first threshold and the second threshold. In accordance with this, an effective power ratio $r_{Pnet}$ of a case in which the reverberation chamber that is a target for determining the first threshold and the second threshold is used can be acquired through scaling based on the first area ratio $r_{S\_ref}$ and the second area ratio $r_S$. In addition, in this embodiment, the surface area of a certain reverberation chamber is a surface area of the inner side of the reverberation chamber. In addition, in this embodiment, the surface area of the first antenna 111 is an area of a maximum plane covering the radiation element of the first antenna 111.

$$r_{Pnet} = 1 - 2r_{loss} \cdot \frac{r_S}{r_{S\_ref}} \quad (5)$$

As in the following Equation (6), a square root of the effective power ratio $r_{Pnet}$ represented by Equation (5) described above represents an electric field intensity ratio $r_E$.

$$r_E = \sqrt{r_{Pnet}} \quad (6)$$

By using Equations (1) to (6) derived in this way, the electric field intensity ratio $r_E$ of the inside of the reverberation chamber 10 can be associated with Z. More specifically, by substituting Equation (5) represented above into Equation (6), the following Equation (7) can be acquired.

$$r_E^2 = 1 - 2r_{loss} \cdot \frac{r_S}{r_{S\_ref}} \quad (7)$$

In addition, by substituting Equation (7) represented above into Equation (3), the following Equation (8) can be acquired.

$$\frac{r_{S\_ref}(1 - r_E^2)}{2r_S} = S \cdot r_P \quad (8)$$

In addition, by substituting Equation (8) represented above into Equation (2) and solving it with respect to $\Gamma$, the following Equation (9) can be acquired.

$$\Gamma = \sqrt{1 - \frac{r_{S\_ref}(1 - r_E^2)}{2r_S r_P}} \quad (9)$$

Then, by substituting Equation (9) represented above into Equation (1) and solving it with respect to Z', the following Equation (10) can be acquired.

$$Z' = \quad (10)$$
$$\begin{cases} -\left(\sqrt{1 - \frac{1 - r_E^2}{2r_P} \cdot \frac{r_{S\_ref}}{r_S}} + 1\right)\left(\sqrt{1 - \frac{1 - r_E^2}{2r_P} \cdot \frac{r_{S\_ref}}{r_S}} - 1\right) & \text{if } Z' \geq 1 \\ -\left(\sqrt{1 - \frac{1 - r_E^2}{2r_P} \cdot \frac{r_{S\_ref}}{r_S}} - 1\right)\left(\sqrt{1 - \frac{1 - r_E^2}{2r_P} \cdot \frac{r_{S\_ref}}{r_S}} + 1\right) & \text{if } Z' < 1 \end{cases}$$

Here, by multiplying both sides of Equation (10) by $Z_0$, Equation (10) represented above can be transformed into an equation with respect to Z as in the following Equation (11) and Equation (12). In this way, the electric field intensity ratio $r_E$ of the inside of the reverberation chamber 10 can be associated with Z. In Equation (11), in order to handle Z represented in Equation (11) as the first threshold described above, "=" is overwritten with "≥". In addition, also in Equation (12), in order to handle Z represented in Equation (12) as the second threshold described above, "=" is overwritten with "≤".

$$Z \leq -Z_0\left(\sqrt{1 - \frac{1 - r_E^2}{2r_P} \cdot \frac{r_{S\_ref}}{r_S}} - 1\right)\left(\sqrt{1 - \frac{1 - r_E^2}{2r_P} \cdot \frac{r_{S\_ref}}{r_S}} + 1\right) \quad (11)$$

$$Z \geq -Z_0\left(\sqrt{1 - \frac{1 - r_E^2}{2r_P} \cdot \frac{r_{S\_ref}}{r_S}} + 1\right)\left(\sqrt{1 - \frac{1 - r_E^2}{2r_P} \cdot \frac{r_{S\_ref}}{r_S}} - 1\right) \quad (12)$$

Equation (11) and Equation (12) represented above are equations representing conditions to be satisfied by Z in a case in which a desired electric field intensity ratio $r_E$ desired to be used as the second allowed value described above is desired to be acquired. Hereinafter, for the convenience of description, a condition represented by Equation (11) will be referred to as a first condition in description. A maximum value of Z satisfying the first condition is the first threshold described above. In other words, Z satisfying the first condition is the first impedance I21 described above. More specifically, the first condition is a condition based on the second allowed value, the ratio $r_S$ of the surface area of the first antenna 111 to the surface area of the reverberation chamber 10, and the characteristic impedance $Z_0$ of the first antenna 111. In addition, hereinafter, for the convenience of description, a condition represented by Equation (12) will be referred to as a second condition in description. A minimum value of Z satisfying the second condition is the second threshold described above. In other words, Z satisfying the second condition is the second impedance I22 described above. In addition, more specifically, the second condition is a condition based on the second allowed value, the ratio $r_S$ of the surface area of the first antenna 111 to the surface area of the reverberation chamber 10, and the characteristic impedance $Z_0$ of the first antenna 111.

In the method of determining the first threshold value and the second threshold value from a theoretical equation, the first threshold is determined using Equation (11) derived in this way, and the second threshold is determined using Equation (12). In deriving of Equation (4) represented above, it has already been considered that there are two paths in which a current flows from the first antenna 111, and thus these two thresholds can be used as thresholds for the impedances of the first power loss inhibiting unit 113 and the second power loss inhibiting unit 115.

Here, for example, in a case in which a frequency average 0.16 of the reception power ratio illustrated in FIG. 2 is a value acquired for a reverberation chamber of $r_{S\_ref}$=0.039, Equation (11) and Equation (12) respectively become the following Equation (13) and Equation (14).

$$Z \leq -Z_0\left(\sqrt{\frac{8.2r_S - 1 + r_E^2}{8.2r_S}} - 1\right)\left(\sqrt{\frac{8.2r_S - 1 + r_E^2}{8.2r_S}} + 1\right) \quad (13)$$

$$Z \geq -Z_0 \left( \sqrt{\frac{8.2r_S - 1 + r_E^2}{8.2r_S}} + 1 \right) \bigg/ \left( \sqrt{\frac{8.2r_S - 1 + r_E^2}{8.2r_S}} - 1 \right) \quad (14)$$

In a case in which a desired electric field intensity ratio $r_E$ desired to be used as the second allowed value is 90[%], Equation (13) and Equation (14) respectively become the following Equation (15) and Equation (16).

$$Z \leq -Z_0 \left( \sqrt{\frac{8.2r_S - 1 + 0.81}{8.2r_S}} - 1 \right) \bigg/ \left( \sqrt{\frac{8.2r_S - 1 + 0.81}{8.2r_S}} + 1 \right) \quad (15)$$

$$Z \geq -Z_0 \left( \sqrt{\frac{8.2r_S - 1 + 0.81}{8.2r_S}} + 1 \right) \bigg/ \left( \sqrt{\frac{8.2r_S - 1 + 0.81}{8.2r_S}} - 1 \right) \quad (16)$$

In addition, a decrease in the electric field intensity of the inside of the reverberation chamber 10 has an influence on a power capacity of the second power supply device 122. For this reason, it is preferable that the amount of decrease in the electric field intensity of the inside of the reverberation chamber 10 be 10[%] or less in consideration of output error of the second power supply device 122. An amount of decrease in the electric field intensity of the inside of the reverberation chamber 10 being [%] or less represents that the second allowed value is 90[%] or more. In addition, in the example described above, a desired electric field intensity ratio $r_E$ desired to be used as the second allowed value being set to 90[%] is valid as an actual design idea. However, the desired electric field intensity ratio $r_E$ desired to be used as the second allowed value may be a value smaller than 90[%] or may be a value larger than 90[%].

A second area ratio $r_S$ of which a value is not substituted into any one of Equation (11) to Equation (16) is, as described above, a ratio of the surface area of the first antenna 111 to the surface area of the reverberation chamber that is a target for determining the first threshold and the second threshold. For this reason, for example, the surface area of the first antenna 111 with respect to the surface area of the reverberation chamber 10 is substituted into the second area ratio $r_S$. In addition, a reverberation chamber having a reference reception power ratio may be any reverberation chamber as long as it is a reverberation chamber of which a reception power ratio has been measured. For this reason, the first area ratio $r_{S\_ref}$ may be the surface area of the first antenna 111 with respect to the surface area of the reverberation chamber 10.

As described above, a manufacturer of the electromagnetic wave test device 1 can determine the first threshold and the second threshold based on one combination among a combination of Equation (11) and Equation (12), a combination of Equation (13) and Equation (14), and a combination of Equation (15) and Equation (16) in a design stage. As a result, the manufacturer can determine the impedance of the first power loss inhibiting unit 113 and the impedance of the second power loss inhibiting unit 115 such that one of the first impedance I21 that is the first threshold or less and the second impedance I22 that is the second threshold or more is the combined impedance. The electromagnetic wave test device 1 including the first power loss inhibiting unit 113 and the second power loss inhibiting unit 115 having the impedances determined in this way can inhibit an increase of the power loss in a radiation immunity test according to the hybrid method.

Figure 6:
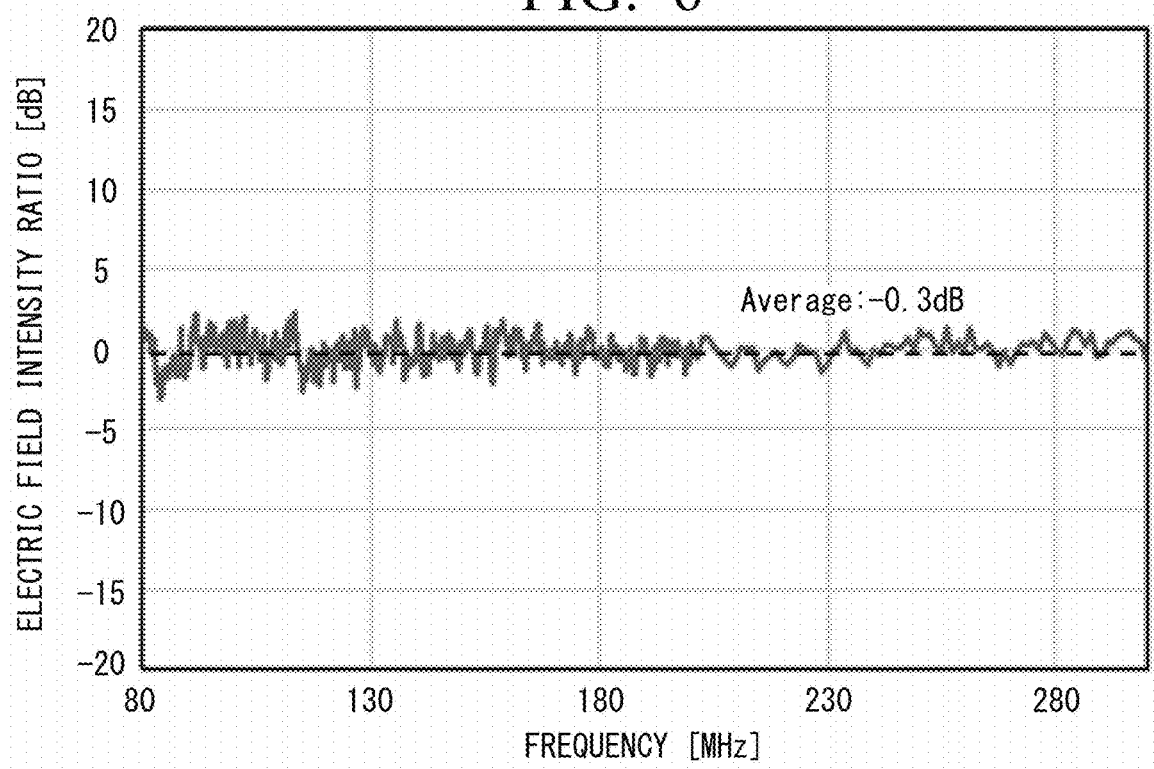
FIG. 6 is a diagram illustrating another example of a change in an electric field intensity ratio with respect to a change in the frequency of an RF signal input to the second antenna 121.

Here, after each of the first power loss inhibiting unit 113 and the second power loss inhibiting unit 115 is connected to the first antenna 111, when electromagnetic waves are radiated from the second antenna 121 while changing the frequency of an RF signal input to the second antenna 121, the electric field intensity ratio changes as illustrated in FIG. 6. FIG. 6 is a diagram illustrating another example of a change of the electric field intensity ratio with respect to a change of the frequency of an RF signal input to the second antenna 121. In FIG. 6, the electric field intensity ratio is represented using a deviation. A vertical axis of a graph illustrated in FIG. 6 represents an electric field intensity ratio represented using the deviation. In addition, a horizontal axis of the graph represents the frequency of the RF signal input to the second antenna 121. In the example illustrated in FIG. 6, the frequency average of the electric field intensity ratio is −0.3 [dB]. In other words, a graph illustrated in FIG. 6 clearly represents that, in a case in which each of the first power loss inhibiting unit 113 and the second power loss inhibiting unit 115 is connected to the first antenna 111 using the switching unit 116, the electric field intensity ratio represented using a deviation is lower than that of a case in which each of the dummy load 112 and the first power supply device 114 is connected to the first antenna 111. Thus, in a radiation immunity test according to the hybrid method, the electromagnetic wave test device 1 can inhibit an increase of the power loss.

<Method for Performing Radiation Immunity Test According to Hybrid Method Using Electromagnetic Wave Test Device>

Figure 7:
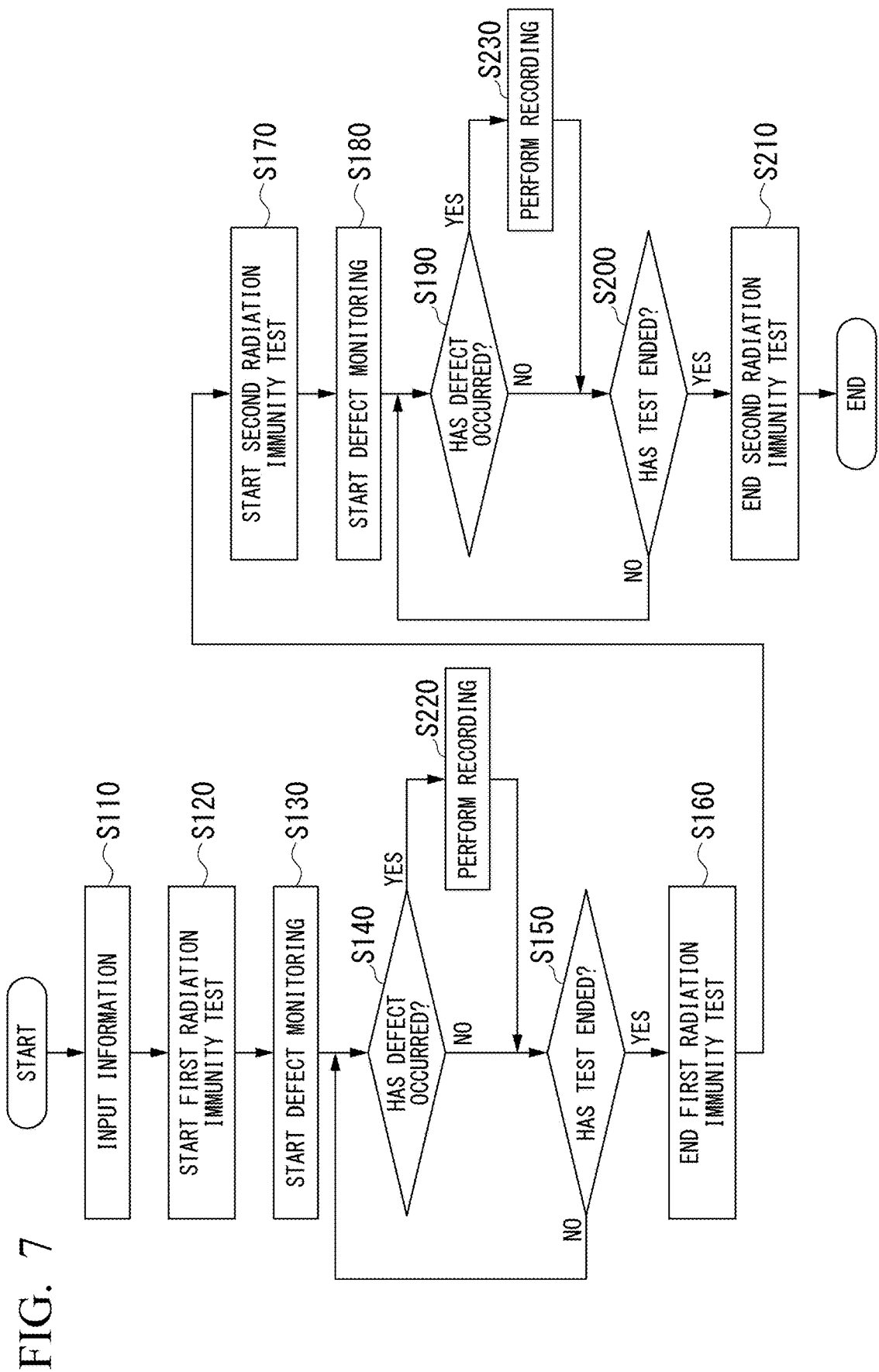
FIG. 7 is a diagram illustrating an example of a flow of a method of performing a radiation immunity test according to a hybrid method using the electromagnetic wave test device 1.

Hereinafter, a method for performing a radiation immunity test according to the hybrid method using the electromagnetic wave test device 1 will be described with reference to FIG. 7. FIG. 7 is a diagram illustrating an example of the flow of the method for performing a radiation immunity test according to the hybrid method using the electromagnetic wave test device 1. Hereinafter, for the convenience of description, a person performing a radiation immunity test according to the hybrid method using the electromagnetic wave test device 1 will be referred to as a measurer in description.

The measurer inputs various kinds of information to the information processing device 14 by operating the information processing device 14 (Step S110). In FIG. 7, a process of Step S110 is represented using "input information". Here, in the various kinds of information, for example, a frequency band of an RF signal input to the first antenna 111, a frequency band of an RF signal input to the second antenna 121, and information representing measurement conditions such as a rotation speed of the electromagnetic stirrer 13 are included. In addition, in the various kinds of information, any other information may be included.

Next, the measurer starts a first radiation immunity test by operating the information processing device 14 (Step S120). Here, the first radiation immunity test is a radiation immunity test according to the TLS method. In addition, in Step S120, at a timing before the first antenna 111 is caused to radiate electromagnetic waves, after the rotation speed input to the information processing device 14 in Step 110 and a rotation speed of the electromagnetic stirrer 13 coincide with each other, the measurer causes the switching unit 116 to switch the connection destination of the first antenna 111 such that the first antenna 111 is connected to the dummy load 112 and the first power supply device 114. Thereafter, the measurer starts input of an RF signal of the frequency band input to the information processing device 14 in Step S110 to the first antenna 111 by operating the information processing device 14.

Next, the measurer starts monitoring of defects occurring in a test piece TM (Step S130). The defects occurring in the test piece TM, for example, are a disturbance of an image on a display in the case of the test piece TM having the display, stop of supply of power from a power supply to the test piece TM, and the like but are not limited thereto.

Next, the measurer judges whether or not a defect has occurred in the test piece TM (Step S140).

In a case in which the measurer judges that no defect has occurred in the test piece TM (Step S140—No), the process proceeds to Step S150.

On the other hand, in a case in which it is judged that a defect has occurred in the test piece TM (Step S140—Yes), the measurer records information representing the defect that has occurred in the test piece TM (Step S220). In addition, a method of recording the information in Step S220 may be any method as long as the information can be recorded. After the process of Step S220 is performed, the measurer causes the process to proceed to Step S150.

In Step S150, the measurer judges whether or not the first radiation immunity test that has started in Step S120 is to be ended (Step S150). In FIG. 7, the process of Step S170 is represented using "Has test ended?". Here, for example, in a case in which the first radiation immunity test that has started in Step S120 is completed, the measurer judges that the first radiation immunity test that has started in Step S120 is to be ended. On the other hand, for example, in a case in which the first radiation immunity test that has started in Step S120 is not completed, the measurer judges that that first radiation immunity test that has started in Step S120 is not to be ended. In addition, the judgement of Step S150 may be performed using another method.

In a case in which it is judged that the first radiation immunity test that has started in Step S120 is not to be ended (Step S150—No), the measurer causes the process to proceed to Step S140 and judges whether or not a defect has occurred in the test piece TM again.

On the other hand, in a case in which it is judged that the first radiation immunity test that has started in Step S120 is to be ended (Step S150—Yes), the measurer ends the first radiation immunity test (Step S160). Here, in Step S160, the measurer, for example, ends the input of the RF signal to the first antenna 111 by operating the information processing device 14.

Next, the measurer starts a second radiation immunity test (Step S170). Here, the second radiation immunity test is a radiation immunity test according to the reverberation chamber method. In addition, in Step S170, at a timing before the second antenna 121 is caused to radiate electromagnetic waves, the measurer causes the switching unit 116 to switch the connection destination of the first antenna 111 such that the first antenna 111 is connected to the first power loss inhibiting unit 113 and the second power loss inhibiting unit 115. Thereafter, the measurer starts input of the RF signal of the frequency band input to the information processing device 14 in Step S110 to the second antenna 121 by operating the information processing device 14.

Next, the measurer starts monitoring of a defect occurring in the test piece TM (Step S180).

Next, the measurer judges whether or not a defect has occurred in the test piece TM (Step S190).

In a case in which it is judged that no defect has occurred in the test piece TM (Step S190—No), the measurer causes the process to proceed to Step S200.

On the other hand, in a case in which it is judged that a defect has occurred in the test piece TM (Step S190—Yes), the measurer records information representing the defect that has occurred in the test piece TM (Step S230). In addition, a method of recording the information in Step S230 may be any method as long as the information can be recorded. After performing the process of Step S230, the measurer causes the process to proceed to Step S200.

In Step S200, the measurer judges whether or not the second radiation immunity test that has started in Step S170 is to be ended (Step S200). In FIG. 7, the process of Step S200 is represented using "Has test ended?". Here, for example, in a case in which the second radiation immunity test that has started in Step S170 is completed, the measurer judges that the second radiation immunity test that has started in Step S170 is to be ended. On the other hand, for example, in a case in which the second radiation immunity test that has started in Step S170 is not completed, the measurer judges that that second radiation immunity test that has started in Step S170 is not to be ended. In addition, the judgement of Step S200 may be performed using another method.

In a case in which it is judged that the second radiation immunity test that has started in Step S170 is not to be ended (Step S200—No), the measurer causes the process to proceed to Step S190 and judges whether or not a defect has occurred in the test piece TM again.

On the other hand, in a case in which it is judged that the second radiation immunity test that has started in Step S170 is to be ended (Step S200—Yes), the measurer ends the second radiation immunity test (Step S210). Here, in Step S210, the measurer, for example, ends the input of the RF signal to the second antenna 121 by operating the information processing device 14. Then, the measurer ends the process of the flowchart illustrated in FIG. 7.

As described above, in a radiation immunity test according to the hybrid method using the electromagnetic wave test device 1 including the reverberation chamber 10, the first antenna 111 that is installed inside the reverberation chamber 10 and configured to radiate electromagnetic waves of a frequency lower than the first resonance frequency of the reverberation chamber 10, the second antenna 121 that is installed inside the reverberation chamber 10 and configured to radiate electromagnetic waves of a frequency equal to or higher than the first resonance frequency, the first power supply device 114 that is connected between a member having the ground electric potential and the first antenna 111 and configured to supply power to the first antenna 111, the dummy load 112 that is connected between the member having the ground electric potential and the first antenna 111, the first power loss inhibiting unit 113 configured to have an impedance corresponding to an allowed value for power loss according to the first antenna 111 in a case in which electromagnetic waves are radiated from the second antenna 121, and the switching unit 116 configured to include a first switching unit SW1 that switches the connection destination of the first antenna 111 to one of the dummy load 112 and the first power loss inhibiting unit 113, the measurer switches the connection destination of the first antenna 111 to the dummy load 112 in a case in which electromagnetic waves are radiated from the first antenna 111 and switches the connection destination of the first antenna 111 to the first power loss inhibiting unit 113 in a case in which electromagnetic waves are radiated from the second antenna 121. In addition, in the radiation immunity test, the measurer switches the connection destination of the first antenna 111 to the first power supply device 114 in a case in which electromagnetic waves are radiated from the first antenna 111 and switches the connection destination of the first antenna 111 to the second power loss inhibiting unit 115 in a case in which electromagnetic waves are radiated from the second antenna 121. In accordance with this, the radiation immunity test can inhibit an increase of the power loss.

In addition, the process of the flowchart illustrated in FIG. 7 may be applied to a radiation immunity test applying an electric field of one certain frequency to the test piece TM or may be applied to a radiation immunity test applying electric fields of a plurality of frequencies to the test piece TM.

Figure 8:
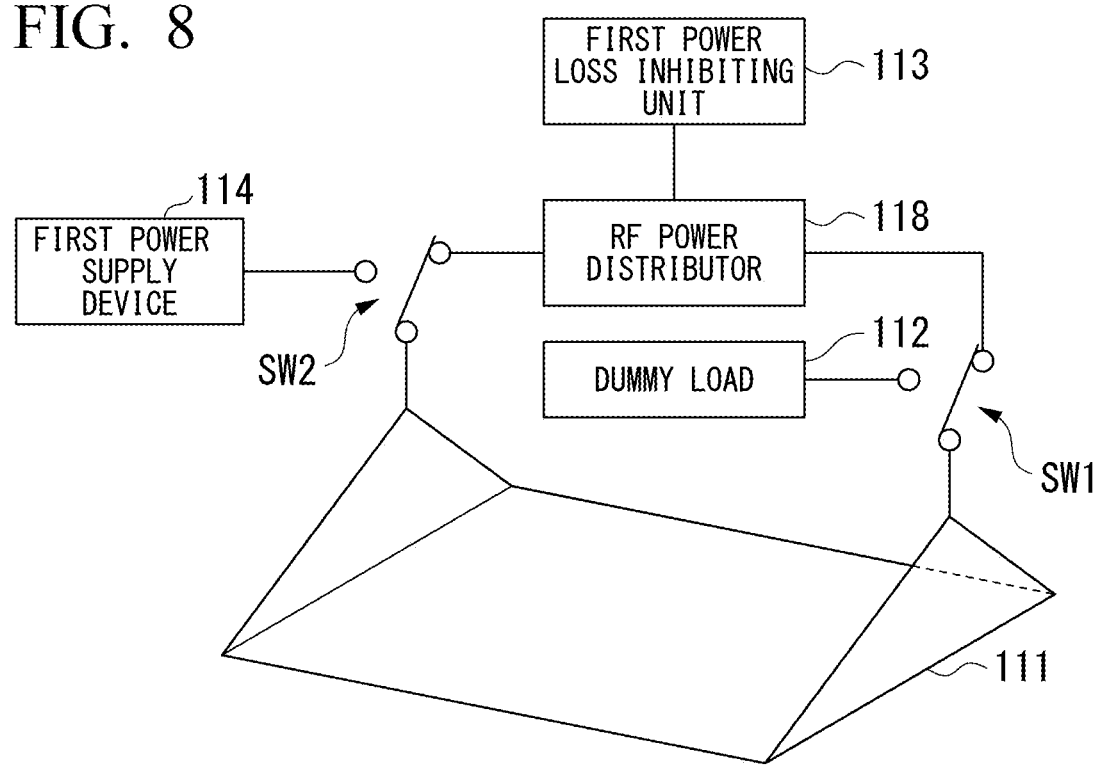
FIG. 8 is a diagram illustrating a modified example of a connection form between a first antenna 111 and a first power loss inhibiting unit 113.

In addition, in a case in which the first power loss inhibiting unit 113 and the second power loss inhibiting unit 115 are integrally configured, the electromagnetic wave test device 1 described above, as illustrated in FIG. 8, may be configured to include an RF power distributor 118. FIG. 8 is a diagram illustrating a modified example of a connection form between the first antenna 111 and the first power loss inhibiting unit 113. In the example illustrated in FIG. 8, the RF power distributor 118 is connected between each of the first switching unit SW1 and the second switching unit SW2 and the first power loss inhibiting unit 113. Also in such a configuration, in a radiation immunity test according to the hybrid method, the electromagnetic wave test device 1 can inhibit an increase of the power loss.

Figure 9:
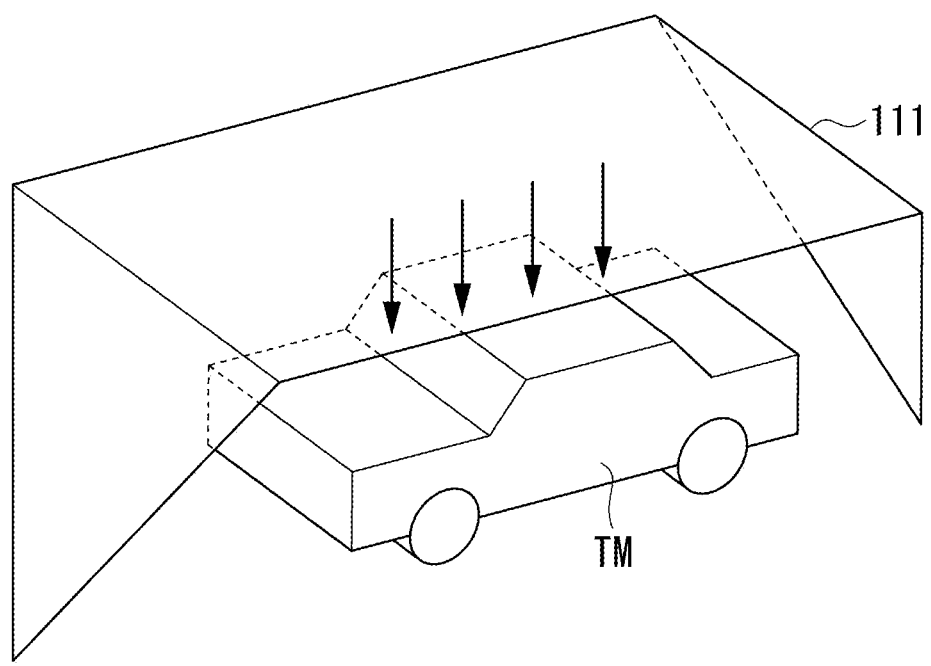
FIG. 9 is a diagram illustrating an example of an appearance of a first antenna 111 connected to a strip line.

In addition, the first antenna 111 described above may be the strip line illustrated in FIG. 9 instead of the TEM plate antenna as described above. FIG. 9 is a diagram illustrating an example of an appearance of the first antenna I11 connected to a strip line. The strip line is an antenna that applies an electric field to a test piece TM using the inside of a parallel flat plate. In a case in which the first antenna 111 is a strip line, as a member having the ground electric potential described above, for example, a member using the floor face of the reverberation chamber 10 by using a metal grounding jig, or using a cable, or the like is frequently used.

Figure 10:
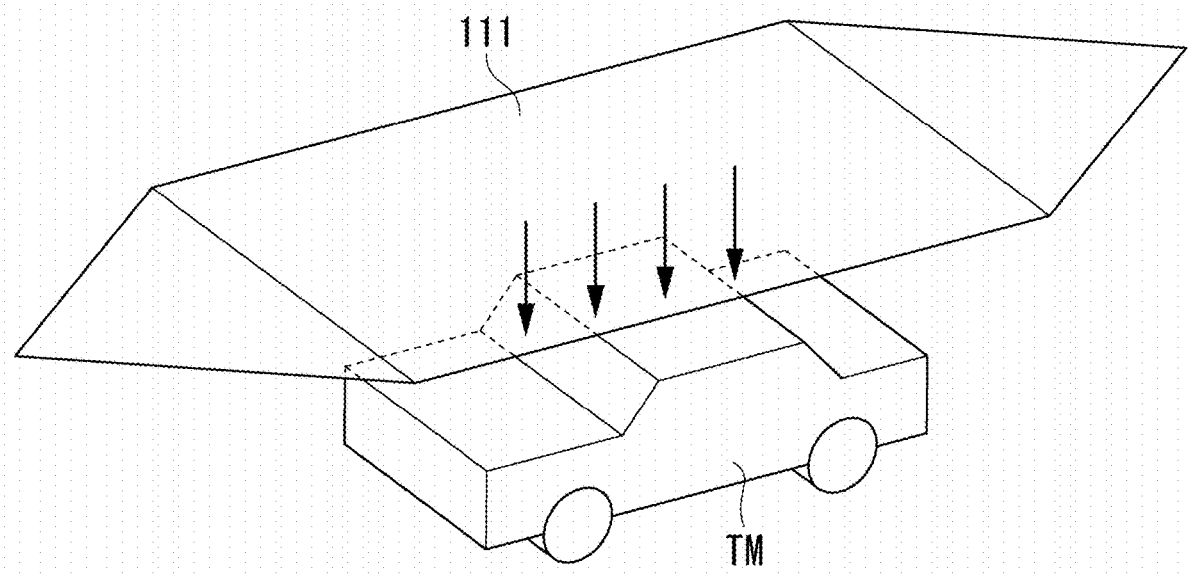
FIG. 10 is a diagram illustrating an example of an appearance of a first antenna 111 connected to a septum.

In addition, the first antenna 11*l* described above may be the septum illustrated in FIG. 10 in place of the TEM plate antenna as described above. FIG. 10 is a diagram illustrating an example of the appearance of the first antenna 111 connected to a septum. In a case in which the first antenna 111 is a septum, as the member having the ground electric potential described above, for example, a side face of the reverberation chambers is frequently used.

Figure 11:
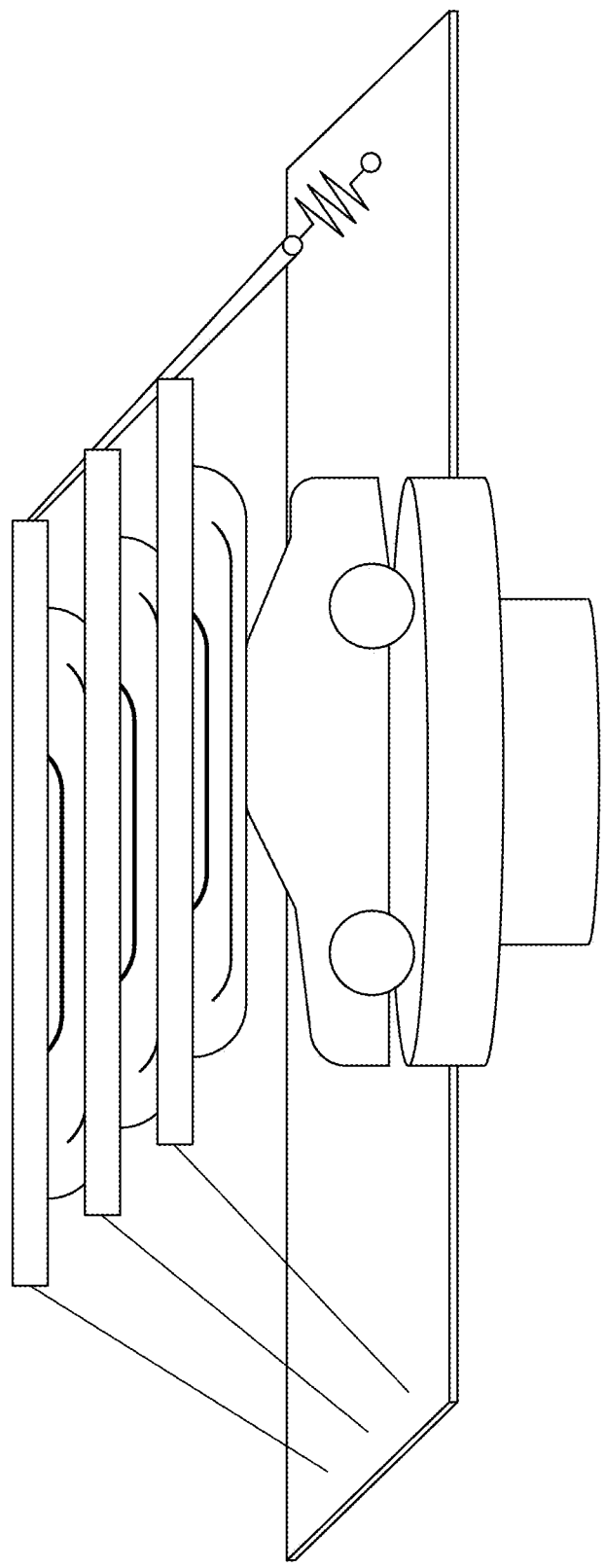

Here, the first antenna 111, as illustrated in FIG. 11, may be an antenna configured using a plurality of lead wires, a plurality of flat plates, or the like in place of the antenna having the flat plate shape. FIG. 11 is a diagram illustrating an example of the first antenna 111 configured using a plurality of lead wires, a plurality flat plates, or the like.

As described above, electromagnetic wave test device according to an embodiment (in the example described above, the electromagnetic wave test device 1) includes: a reverberation chamber (in the example described above, the reverberation chamber 10); a first antenna (in the example described above, the first antenna 111) installed inside the reverberation chamber and configured to radiate electromagnetic waves of a frequency lower than a first resonance frequency of the reverberation chamber; a second antenna (in the example described above, the second antenna 121) installed inside the reverberation chamber and configured to radiate electromagnetic waves of a frequency equal to or higher than the first resonance frequency; a power supply device (in the example describe above, the first power supply device 114) connected between a member having a ground electric potential and the first antenna and configured to supply power to the first antenna; a dummy load (in the example described above the dummy load 112) connected between the member having the ground electric potential and the first antenna; a first power loss inhibiting unit (the first power loss inhibiting unit 113) configured to have an impedance (in the example described above, each of the first impedance I11, the second impedance I12, the first impedance I21, and the second impedance I22) corresponding to an allowed value (in the example described above, each of the first allowed value and the second allowed value) for power loss according to the first antenna in a case in which electromagnetic waves are radiated from the second antenna; and a switching unit (in the example described above, the switching unit 116) configured to include a first switching unit (in the example described above, the first switching unit SW1) that switches a connection destination of the first antenna to one of the dummy load and the first power loss inhibiting unit. In accordance with this, in a radiation immunity test according to the hybrid method, the electromagnetic wave test device can inhibit an increase of the power loss.

In addition, in the electromagnetic wave test device, a configuration in which the first power loss inhibiting unit is an open end may be used.

In addition, in the electromagnetic wave test device, a configuration in which the first power loss inhibiting unit is a termination resistor may be used.

In addition, in the electromagnetic wave test device, a configuration in which the first power loss inhibiting unit is a member having the ground electric potential may be used.

In addition, in the electromagnetic wave test device, a configuration in which the switching unit further includes a third switching unit (in the example described above, the first switching unit SW1) switching the connection destination of the first antenna to one of the power supply device and the first power loss inhibiting unit may be used.

Furthermore, electromagnetic wave test device includes: a reverberation chamber; a first antenna installed inside the reverberation chamber and configured to radiate electromagnetic waves of a frequency lower than a first resonance frequency of the reverberation chamber; a second antenna installed inside the reverberation chamber and configured to radiate electromagnetic waves of a frequency equal to or higher than the first resonance frequency; a power supply device connected between a member having a ground electric potential and the first antenna and configured to supply power to the first antenna; a second power loss inhibiting unit (in the example described above, the second power loss inhibiting unit 115) configured to have an impedance corresponding to an allowed value for power loss according to the first antenna in a case in which electromagnetic waves are radiated from the second antenna and configured to be different from an open end; and a switching unit configured to include a second switching unit that switches a connection destination of the first antenna to one of the power supply device and the second power loss inhibiting unit (in the example described above, the second switching unit SW2). In accordance with this, in a radiation immunity test according to the hybrid method, the electromagnetic wave test device can inhibit an increase of the power loss.

In addition, in the electromagnetic wave test device, a configuration in which the second power loss inhibiting unit is a termination resistor may be used.

In addition, in the electromagnetic wave test device, a configuration in which the second power loss inhibiting unit is a member having the ground electric potential may be used.

In addition, in the electromagnetic wave test device, a configuration in which the impedance is a first impedance that is less than a first threshold determined in accordance with the allowed value in advance or a second impedance that is equal to or higher than a second threshold determined in accordance with the allowed value in advance, and the second threshold has a value larger than the first threshold may be used.

In addition, in the electromagnetic wave test device, a configuration in which the first impedance is an impedance satisfying a first condition based on the allowed value, a ratio of a surface area of the first antenna to a surface area of the reverberation chamber, and a characteristic impedance of the first antenna, and the second impedance is an impedance satisfying a second condition based on the allowed value, the ratio of the surface area of the first antenna to the surface area of the reverberation chamber, and the characteristic impedance of the first antenna may be used.

In addition, in the electromagnetic wave test device, a configuration in which the first condition is represented using Equation (13) represented above, the second condition is represented using Equation (14) represented above, $r_E$ represents the allowed value, $r_S$ represents the ratio of the surface area of the first antenna to the surface area of the reverberation chamber, and $Z_0$ represents the characteristic impedance of the first antenna may be used.

In addition, in the electromagnetic wave test device, a configuration in which the first condition is represented using Equation (15) represented above, the second condition is represented using Equation (16) represented above, $r_f$ represents the allowed value, $r_S$ represents the ratio of the surface area of the first antenna to the surface area of the reverberation chamber, and $Z_0$ represents the characteristic impedance of the first antenna may be used.

Furthermore, electromagnetic wave test device includes: a reverberation chamber; a first antenna installed inside the reverberation chamber and configured to radiate electromagnetic waves of a frequency lower than a first resonance frequency of the reverberation chamber; a second antenna installed inside the reverberation chamber and configured to radiate electromagnetic waves of a frequency equal to or higher than the first resonance frequency; a power supply device connected between a member having a ground electric potential and the first antenna and feeding power to the first antenna; a dummy load connected between the member having the ground electric potential and the first antenna; a first power loss inhibiting unit configured to have an impedance determined in advance; a second power loss inhibiting unit configured to have an impedance determined in advance; and a switching unit configured to include a first switching unit that switches a connection destination of the first antenna to one of the dummy load and the first power loss inhibiting unit and a second switching unit that switches the connection destination of the first antenna to one of the power supply device and the second power loss inhibiting unit, in which a combined impedance of the impedance of the first power loss inhibiting unit and the impedance of the second power loss inhibiting unit is an impedance corresponding to an allowed value for power loss according to the first antenna in a case in which electromagnetic waves are radiated from the second antenna. In accordance with this, in a radiation immunity test according to the hybrid method, the electromagnetic wave test device can inhibit an increase of the power loss.

In addition, in the electromagnetic wave test device, a configuration in which the first power loss inhibiting unit and the second power loss inhibiting unit are open ends may be used.

In addition, in the electromagnetic wave test device, a configuration in which the first power loss inhibiting unit and the second power loss inhibiting unit are termination resistors may be used.

In addition, in the electromagnetic wave test device, a configuration in which the first power loss inhibiting unit and the second power loss inhibiting unit are members having the ground electric potential may be used.

In addition, in the electromagnetic wave test device, a configuration of an operation unit accepting an operation for causing the switching unit to perform switching of connection may be used.

In addition, in the electromagnetic wave test device, a configuration of a control device (in the example describe above, the first control device 117) causing the switching unit to perform switching of connection may be used.

As above, although the embodiment of the present invention has been described in detail with reference to the drawings, a specific configuration is not limited to this embodiment, and changes, substitutions, deletions, and the like may be made without departing from the concept of the present invention.

EXPLANATION OF REFERENCES

1 Electromagnetic wave test device
10 Reverberation chamber
11 First test device
12 Second test device
13 Electromagnetic stirrer
14 Information processing device
111 First antenna
112 Dummy load
113 First power loss inhibiting unit
114 First power supply device
115 Second power loss inhibiting unit
116 Switching unit
117 First control device
118 RF power distributor
121 Second antenna
122 Second power supply device
123 Second control device
SW1 First switching unit
SW2 Second switching unit
TM test piece
X Resistance element

What is claimed is:
1. Electromagnetic wave test device comprising:
a reverberation chamber;
a first antenna installed inside the reverberation chamber and configured to radiate electromagnetic waves of a frequency lower than a first resonance frequency of the reverberation chamber;
a second antenna installed inside the reverberation chamber and configured to radiate electromagnetic waves of a frequency equal to or higher than the first resonance frequency;
a power supply device connected between a member having a ground electric potential and the first antenna and configured to supply power to the first antenna;
a dummy load connected between the member having the ground electric potential and the first antenna;

a first power loss inhibiting unit configured to have an impedance corresponding to an allowed value for power loss according to the first antenna in a case in which electromagnetic waves are radiated from the second antenna; and a switching unit configured to include a first switching unit that switches a connection destination of the first antenna to one of the dummy load and the first power loss inhibiting unit.

2. The electromagnetic wave test device according to claim 1, wherein the first power loss inhibiting unit is an open end.

3. The electromagnetic wave test device according to claim 1, wherein the first power loss inhibiting unit is a termination resistor.

4. The electromagnetic wave test device according to claim 1, wherein the first power loss inhibiting unit is a member having the ground electric potential.

5. The electromagnetic wave test device according to claim 1, wherein the switching unit further includes a third switching unit switching the connection destination of the first antenna to one of the power supply device and the first power loss inhibiting unit.

6. Electromagnetic wave test device comprising:
a reverberation chamber; a first antenna installed inside the reverberation chamber and configured to radiate electromagnetic waves of a frequency lower than a first resonance frequency of the reverberation chamber;
a second antenna installed inside the reverberation chamber and configured to radiate electromagnetic waves of a frequency equal to or higher than the first resonance frequency;
a power supply device connected between a member having a ground electric potential and the first antenna and configured to supply power to the first antenna;
a first power loss inhibiting unit configured to have an impedance corresponding to an allowed value for power loss according to the first antenna in a case in which electromagnetic waves are radiated from the second antenna and configured to be different from an open end; and
a switching unit configured to switch a connection destination of the first antenna to one of the power supply device and the first power loss inhibiting unit.

7. The electromagnetic wave test device according to claim 6, wherein the first power loss inhibiting unit is a termination resistor.

8. The electromagnetic wave test device according to claim 6, wherein the first power loss inhibiting unit is a member having the ground electric potential.

9. The electromagnetic wave test device according to claim 1,
wherein the impedance is a first impedance that is less than a first threshold determined in accordance with the allowed value in advance or a second impedance that is equal to or higher than a second threshold determined in accordance with the allowed value in advance, and
wherein the second threshold has a value larger than the first threshold.

10. The electromagnetic wave test device according to claim 9,
wherein the first impedance is an impedance satisfying a first condition based on the allowed value, a ratio of a surface area of the first antenna to a surface area of the reverberation chamber, and a characteristic impedance of the first antenna, and wherein the second impedance is an impedance satisfying a second condition based on the allowed value, the ratio of the surface area of the first antenna to the surface area of the reverberation chamber, and the characteristic impedance of the first antenna.

11. The electromagnetic wave test device according to claim 10,
wherein the first condition is represented using the following Equation (1), $$Z \leq -Z_0 \left( \sqrt{\frac{8.2 r_S - 1 + r_E^2}{8.2 r_S}} - 1 \right) \left( \sqrt{\frac{8.2 r_S - 1 + r_E^2}{8.2 r_S}} + 1 \right) \quad (1)$$

and wherein the second condition is represented using the following Equation (2)

$$Z \geq -Z_0 \left( \sqrt{\frac{8.2 r_S - 1 + r_E^2}{8.2 r_S}} + 1 \right) \left( \sqrt{\frac{8.2 r_S - 1 + r_E^2}{8.2 r_S}} - 1 \right) \quad (2)$$

where $r_E$ represents the allowed value,
$r_S$ represents the ratio of the surface area of the first antenna to the surface area of the reverberation chamber, and
$Z_0$ represents the characteristic impedance of the first antenna.

12. The electromagnetic wave test device according to claim 10,
wherein the first condition is represented using the following Equation (3), and $$Z \leq -Z_0 \left( \sqrt{\frac{8.2 r_S - 1 + 0.81}{8.2 r_S}} - 1 \right) \left( \sqrt{\frac{8.2 r_S - 1 + 0.81}{8.2 r_S}} + 1 \right) \quad (3)$$

wherein the second condition is represented using the following Equation (4), $$Z \geq -Z_0 \left( \sqrt{\frac{8.2 r_S - 1 + 0.81}{8.2 r_S}} + 1 \right) \left( \sqrt{\frac{8.2 r_S - 1 + 0.81}{8.2 r_S}} - 1 \right) \quad (4)$$

where $r_E$ represents the allowed value,
$r_S$ represents the ratio of the surface area of the first antenna to the surface area of the reverberation chamber, and
$Z_0$ represents the characteristic impedance of the first antenna.

13. Electromagnetic wave test device comprising:
a reverberation chamber;
a first antenna installed inside the reverberation chamber and configured to radiate electromagnetic waves of a frequency lower than a first resonance frequency of the reverberation chamber;
a second antenna installed inside the reverberation chamber and configured to radiate electromagnetic waves of a frequency equal to or higher than the first resonance frequency;
a power supply device connected between a member having a ground electric potential and the first antenna and feeding power to the first antenna;

a dummy load connected between the member having the ground electric potential and the first antenna;
a first power loss inhibiting unit configured to have an impedance determined in advance;
a second power loss inhibiting unit configured to have an impedance determined in advance; and
a switching unit configured to include a first switching unit that switches a connection destination of the first antenna to one of the dummy load and the first power loss inhibiting unit and a second switching unit that switches the connection destination of the first antenna to one of the power supply device and the second power loss inhibiting unit,
wherein a combined impedance of the impedance of the first power loss inhibiting unit and the impedance of the second power loss inhibiting unit is an impedance corresponding to an allowed value for power loss according to the first antenna in a case in which electromagnetic waves are radiated from the second antenna.

14. The electromagnetic wave test device according to claim 13, wherein the first power loss inhibiting unit and the second power loss inhibiting unit are open ends.

15. The electromagnetic wave test device according to claim 13, wherein the first power loss inhibiting unit and the second power loss inhibiting unit are termination resistors.

16. The electromagnetic wave test device according to claim 13, wherein the first power loss inhibiting unit and the second power loss inhibiting unit are members having the ground electric potential.

17. The electromagnetic wave test device according to claim 13,
wherein the combined impedance is a first impedance that is less than a first threshold determined in accordance with the allowed value in advance or a second impedance that is equal to or higher than a second threshold determined in accordance with the allowed value in advance, and
wherein the second threshold has a value larger than the first threshold.

18. The electromagnetic wave test device according to claim 17,
wherein the first impedance is an impedance satisfying a first condition based on the allowed value, a ratio of a surface area of the first antenna to a surface area of the reverberation chamber, and a characteristic impedance of the first antenna, and
wherein the second impedance is an impedance satisfying a second condition based on the allowed value, the ratio of the surface area of the first antenna to the surface area of the reverberation chamber, and the characteristic impedance of the first antenna.

19. The electromagnetic wave test device according to claim 18,
wherein the first condition is represented using the following Equation (5), $$Z \le -Z_0 \left( \sqrt{\frac{8.2 r_S - 1 + r_E^2}{8.2 r_S}} - 1 \right) \left( \sqrt{\frac{8.2 r_S - 1 + r_E^2}{8.2 r_S}} + 1 \right) \quad (5)$$

and wherein the second condition is represented using the following Equation (6), $$Z \ge -Z_0 \left( \sqrt{\frac{8.2 r_S - 1 + r_E^2}{8.2 r_S}} + 1 \right) \left( \sqrt{\frac{8.2 r_S - 1 + r_E^2}{8.2 r_S}} - 1 \right) \quad (6)$$

where $r_E$ represents the allowed value,
$r_S$ represents the ratio of the surface area of the first antenna to the surface area of the reverberation chamber, and
$Z_0$ represents the characteristic impedance of the first antenna.

20. The electromagnetic wave test device according to claim 18,
wherein the first condition is represented using the following Equation (7), $$Z \le -Z_0 \left( \sqrt{\frac{8.2 r_S - 1 + 0.81}{8.2 r_S}} - 1 \right) \left( \sqrt{\frac{8.2 r_S - 1 + 0.81}{8.2 r_S}} + 1 \right) \quad (7)$$

wherein the second condition is represented using the following Equation (8), $$Z \ge -Z_0 \left( \sqrt{\frac{8.2 r_S - 1 + 0.81}{8.2 r_S}} + 1 \right) \left( \sqrt{\frac{8.2 r_S - 1 + 0.81}{8.2 r_S}} - 1 \right) \quad (8)$$

where $r_E$ represents the allowed value,
$r_S$ represents the ratio of the surface area of the first antenna to the surface area of the reverberation chamber, and
$Z_0$ represents the characteristic impedance of the first antenna.

21. The electromagnetic wave test device according to claim 1, further comprising an operation unit configured to accept an operation for causing the switching unit to perform switching of connection.

22. The electromagnetic wave test device according to claim 1, further comprising a control device causing the switching unit to perform switching of connection.

* * * * *